United States Patent
Okuno et al.

(10) Patent No.: US 11,994,332 B2
(45) Date of Patent: May 28, 2024

(54) COOLING UNIT

(71) Applicant: Nidec Corporation, Kyoto (JP)

(72) Inventors: Takaya Okuno, Kyoto (JP); Toshihiko Tokeshi, Kyoto (JP); Takehito Tamaoka, Kyoto (JP)

(73) Assignee: Nidec Corporation, Kyoto (JP)

( * ) Notice: Subject to any disclaimer, the term of this patent is extended or adjusted under 35 U.S.C. 154(b) by 224 days.

(21) Appl. No.: 17/381,253

(22) Filed: Jul. 21, 2021

(65) Prior Publication Data

US 2022/0030747 A1 Jan. 27, 2022

(30) Foreign Application Priority Data

Jul. 22, 2020 (JP) .................................. 2020-125612
Feb. 8, 2021 (JP) .................................. 2021-018304

(51) Int. Cl.
*F28F 3/02* (2006.01)
*F25D 11/02* (2006.01)
*F25D 17/02* (2006.01)
*F25D 23/06* (2006.01)
*F28F 3/12* (2006.01)
*H05K 7/20* (2006.01)

(52) U.S. Cl.
CPC .............. *F25D 17/02* (2013.01); *F25D 11/02* (2013.01); *F25D 23/069* (2013.01); *F28F 3/02* (2013.01); *F28F 3/12* (2013.01); *H05K 7/20254* (2013.01); *H05K 7/20272* (2013.01)

(58) Field of Classification Search
CPC .......... H05K 7/20254; F28F 3/12; F28F 3/02
See application file for complete search history.

(56) References Cited

U.S. PATENT DOCUMENTS

| 7,007,506 | B2* | 3/2006 | Kubo | H05K 7/20309 165/170 |
| 7,360,582 | B2* | 4/2008 | Olesen | H01L 23/473 257/E23.098 |
| 2016/0309618 | A1* | 10/2016 | Tsai | H01L 23/473 |
| 2017/0196116 | A1* | 7/2017 | Lyon | F28D 15/00 |
| 2019/0239388 | A1* | 8/2019 | Tsai | H05K 7/20254 |

FOREIGN PATENT DOCUMENTS

JP  2020-088108 A  6/2020

\* cited by examiner

*Primary Examiner* — Jenna M Hopkins
(74) *Attorney, Agent, or Firm* — Keating & Bennett, LLP

(57) ABSTRACT

A cooling assembly includes a cold plate in contact with a heat generating component, a housing on one side of the cooling assembly in a first direction with respect to the cold plate, a first wall located between the housing and the cold plate, and a second wall separating a plate chamber defined by the housing and the first wall into a first plate chamber and a second plate chamber adjacent to each other in a second direction orthogonal to the first direction. The first wall includes a first through hole opposing the cold plate in the first plate chamber and a second through hole opposing the cold plate in the second plate chamber.

20 Claims, 27 Drawing Sheets

COOLING UNIT

CROSS-REFERENCE TO RELATED APPLICATIONS

The present invention claims priority under 35 U.S.C. § 119 to Japanese Patent Application No. 2020-125612, filed on Jul. 22, 2020, and Japanese Patent Application No. 2021-018304, filed on Feb. 8, 2021, the entire contents of which are hereby incorporated herein by reference.

1. FIELD OF THE INVENTION

The present disclosure relates to a cooling assembly.

2. BACKGROUND

Cooling apparatuses have been conventionally known, the cooling systems each including a metal cooling panel for cooling a heating element such as a battery or an electronic component, and a resin flow path that is joined to the metal cooling panel and through which coolant flows. In the conventional cooling apparatus, the resin flow path has a coolant injection port and a coolant recovery port. In this cooling apparatus, the resin flow path is provided with a flow path in a horizontal direction with respect to the heating element.

The flow path in the conventional cooling apparatus has an inlet and an outlet through which the coolant flows in and out, and the coolant flows evenly throughout the flow path when the coolant has a constant flow rate at any location. Unfortunately, the flow rate of the coolant is not actually constant. For example, when a pump is provided near the coolant injection port and a coolant flow branch port, the coolant has a high flow rate toward the coolant injection port and the coolant flow branch port, and a low flow rate toward a coolant confluence port and the coolant recovery port. Thus, the coolant is likely to accumulate at the coolant confluence port and the coolant recovery port, so that cooling efficiency is lowered there.

SUMMARY

A cooling assembly according to an example embodiment of the present disclosure includes a cold plate in contact with a heat generating component, a housing on one side of the cooling assembly in a first direction with respect to the cold plate, a first wall located between the housing and the cold plate, and a second wall separating a plate chamber defined by the housing and the first wall into a first plate chamber and a second plate chamber adjacent to each other in a second direction orthogonal to the first direction. The first wall includes a first through hole opposing the cold plate in the first plate chamber and a second through hole opposing the cold plate in the second plate chamber.

The above and other elements, features, steps, characteristics and advantages of the present disclosure will become more apparent from the following detailed description of the example embodiments with reference to the attached drawings.

DETAILED DESCRIPTION

Hereinafter, example embodiments of the present disclosure will be described with reference to the drawings. In the present application, a direction in which a housing 2 is disposed with respect to a cold plate 1 is referred to as a "first direction X". Then, a vertical direction is defined such that a direction in which the housing 2 is disposed with respect to the cold plate 1 is referred to as an "upper side Xa", and a direction opposite to the direction in which the housing 2 is disposed is referred to as a "lower side Xb". In the present application, the vertical direction and a horizontal direction are defined for convenience of description, and thus do not limit an orientation of a cooling assembly A according to a preferred embodiment of the present disclosure at the time of manufacture and at the time of use.

A direction orthogonal to the first direction X is referred to as a "second direction Y". The direction on one side in the second direction Y is referred to as "one side Ya in the second direction", and the direction on the other side is referred to as "the other side Yb in the second direction". Then, a direction orthogonal to the first direction X and the second direction Y is referred to as a "third direction Z". The direction on one side in the third direction Z is referred to as "one side Za in the third direction", and the direction on the other side is referred to as "the other side Zb in the third direction".

Additionally, an "orthogonal direction" in the present disclosure includes a substantially orthogonal direction.

Figure 1:
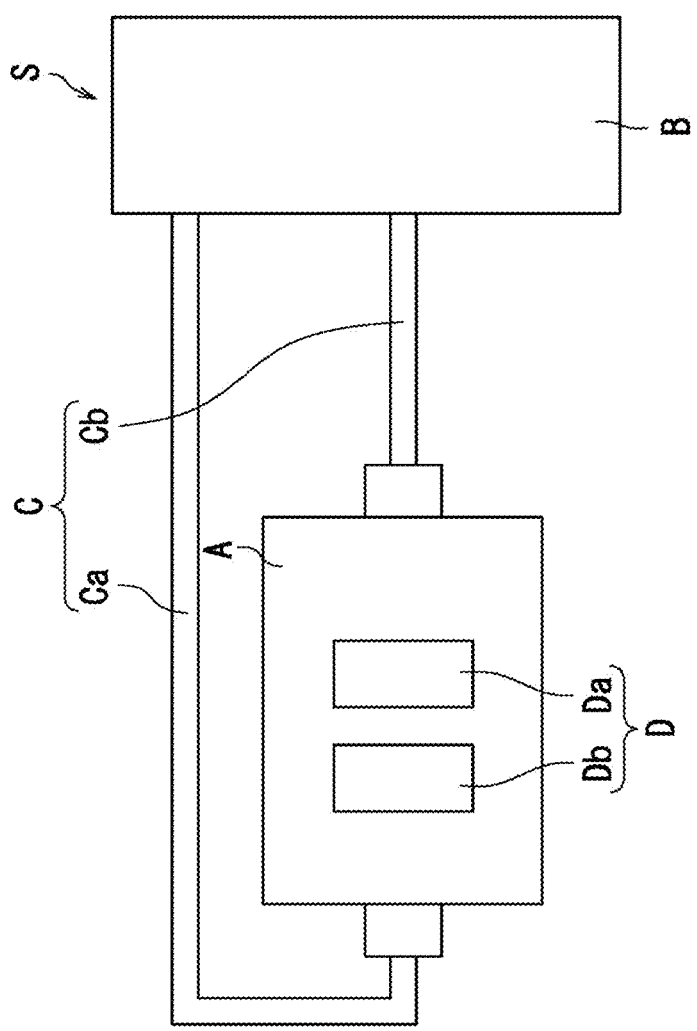
FIG. 1 is a schematic view of a cooling system including a cooling assembly of an example embodiment of the present disclosure.
Figure 2:
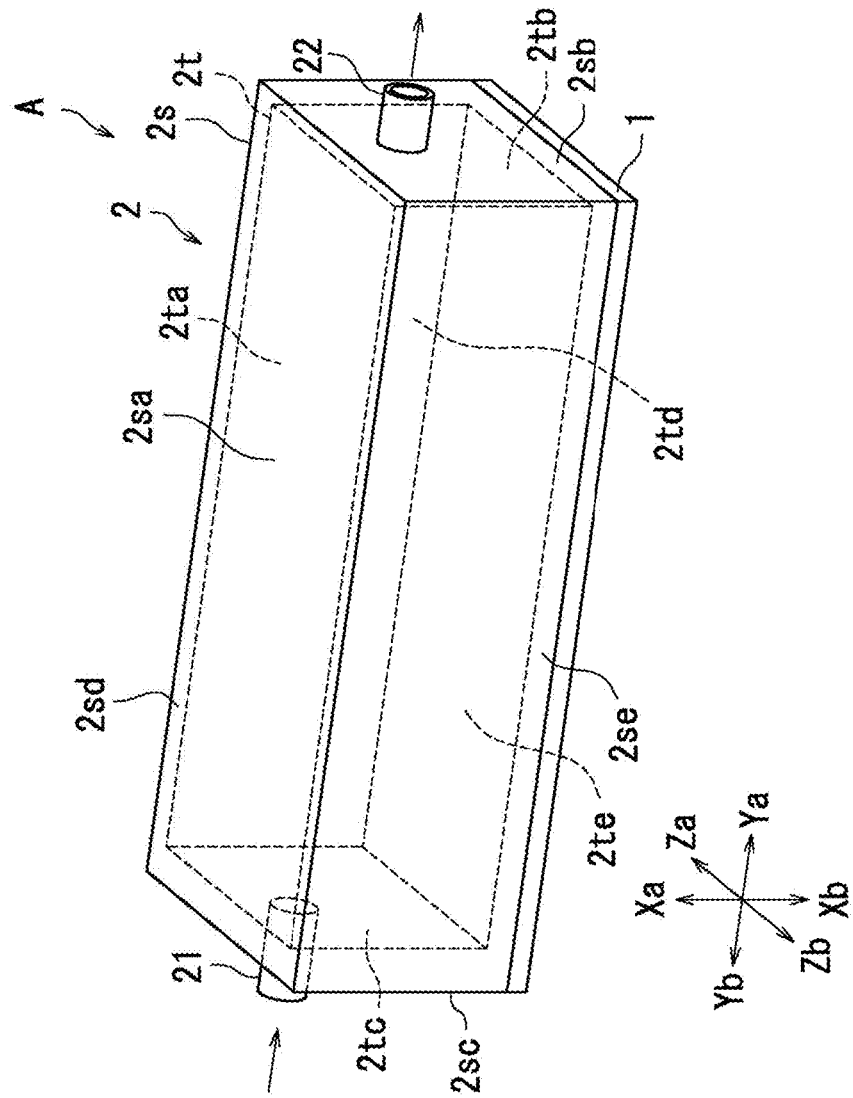
FIG. 2 is a general perspective view of a cooling assembly according to a first example embodiment of the present disclosure.

A cooling system S and the cooling assembly A according to the first example embodiment of the present disclosure will be described. FIG. 1 is a schematic view of the cooling system S equipped with the cooling assembly A of the present disclosure. FIG. 2 is a general perspective view of the cooling assembly A according to a first example embodiment of the present disclosure.

FIG. 1 is a schematic view of the cooling system S equipped with the cooling assembly A of the present disclosure. The cooling system S includes the cooling assembly A, a radiator B, and a coolant pipe C. The cooling assembly A and the radiator B communicate with each other using a coolant pipe C, and coolant flows through these components. The coolant in the present example embodiment is a liquid. As the coolant, available examples of the liquid include an antifreeze such as an ethylene glycol aqueous solution or a propylene glycol aqueous solution, and pure water.

The cooling assembly A is provided with a heat generating component D attached as a heat source, and the cooling assembly A receives heat from the heat generating component D. Examples of the heat generating component D include a microprocessor used in a computer, a power semiconductor used in an inverter, and the like. The cooling assembly A receives heat that transfers using the coolant flowing through the coolant pipe C into the radiator B. When the coolant having the heat flows through the radiator B, the heat is dissipated to the outside.

Here, the heat generating component D includes a first heat generating component Da and a second heat generating component Db. Both the first heat generating component Da and the second heat generating component Db are attached to the cooling assembly A.

The coolant pipe C includes a first pipe Ca and a second pipe Cb. The first pipe Ca connects the radiator B and the cooling assembly A. The second pipe Cb connects the cooling assembly A and the radiator B. The coolant cooled in the radiator B flows into the cooling assembly A via the first pipe Ca. The coolant flowing out of the cooling assembly A flows to the radiator B via the second pipe Cb. In this manner, the coolant circulates through the radiator B and the cooling assembly A via the first pipe Ca and the second pipe Cb.

Although not particularly illustrated in FIG. 1, the cooling system S preferably includes a pump for circulating a coolant. Typically, the pump is arranged in the coolant pipe C. However, the pump may be mounted on the cooling assembly A.

As illustrated in FIG. 2, the cooling assembly A includes a cold plate 1 and a housing 2. The cold plate 1 has a plate shape. Here, the cold plate 1 has a flat plate shape. The housing 2 has a box shape with one surface opened. The housing 2 is disposed on the upper side Xa in the first direction of the cold plate 1. The opening of the housing 2 is covered by the cold plate 1.

The housing 2 includes an inflow port 21 through which coolant flows into the housing 2, and an outflow port 22 through which the coolant flows out of the housing 2. The coolant pipe C is attached to each of the inflow port 21 and the outflow port 22.

The housing 2 has a substantially rectangular parallelepiped shape with one surface opened. The housing 2 has an outer peripheral surface 2s and an inner peripheral surface 2t. A specific configuration of the housing 2 will be described later.

The outer peripheral surface 2s of the housing 2 has an outer main surface 2sa, a first outer side surface 2sb, a second outer side surface 2sc, a third outer side surface 2sd, and a fourth outer side surface 2se. The first outer side surface 2sb and the second outer side surface 2sc are connected to the outer main surface 2sa. The third outer side surface 2sd and the fourth outer side surface 2se are connected to the outer main surface 2sa, the first outer side surface 2sb, and the second outer side surface 2sc, respectively. The outer main surface 2sa is located on the upper side Xa in the first direction. The first outer side surface 2sb is located on one side Ya in the second direction, and the second outer side surface 2sc is located on the other side Yb in the second direction. The third outer side surface 2sd is located at one side Za in the third direction, and the fourth outer side surface 2se is located on the other side Zb in the third direction. Here, each of the outer main surface 2sa, the first outer side surface 2sb, the second outer side surface 2sc, the third outer side surface 2sd, and the fourth outer side surface 2se is a flat surface.

The inner peripheral surface 2t of the housing 2 includes an inner main surface 2ta, a first inner side surface 2tb, a second inner side surface 2tc, a third inner side surface 2td, and a fourth inner side surface 2te. The first inner side surface 2tb and the second inner side surface 2tc are each connected to the inner main surface 2ta. The third inner side surface 2td and the fourth inner side surface 2te are connected to the inner main surface 2*ta*, the first inner side surface 2*tb*, and the second inner side surface 2*tc*, respectively. The inner main surface 2*ta* is located on the upper side Xa in the first direction. The first inner side surface 2*tb* is located on one side Ya in the second direction, and the second inner side surface 2*tc* is located on the other side Yb in the second direction. The third inner side surface 2*td* is located on one side Za in the third direction, and the fourth inner side surface 2*te* is located on the other side Zb in the third direction. Here, each of the inner main surface 2*ta*, the first inner side surface 2*tb*, the second inner side surface 2*tc*, the third inner side surface 2*td*, and the fourth inner side surface 2*te* is a flat surface.

The inflow port 21 is provided in the second outer side surface 2*sc*. The inflow port 21 connects the second outer side surface 2*sc* and the second inner side surface 2*tc*. The outflow port 22 is provided on the first outer side surface 2*sb*. The outflow port 22 connects the first outer side surface 2*sb* and the first inner side surface 2*tb*.

Figure 3A:
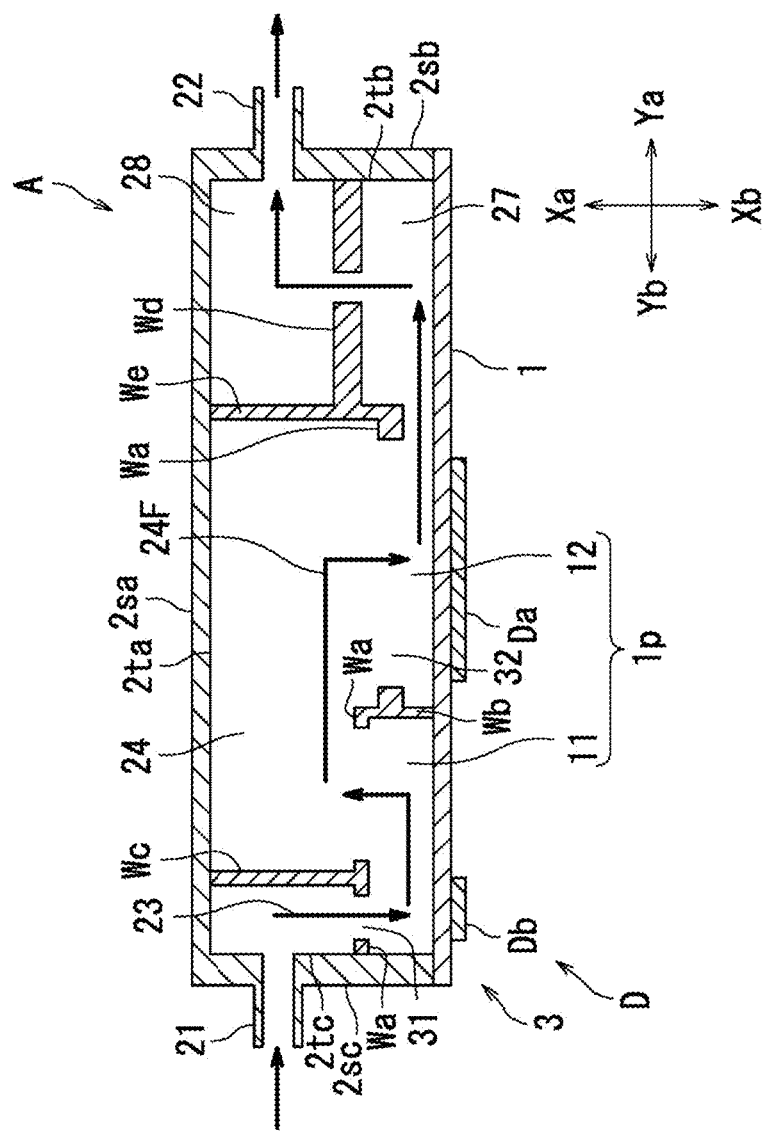
FIG. 3A is a schematic sectional view of the cooling assembly according to the first example embodiment of the present disclosure.

Next, a cooling assembly A according to a first example embodiment of the present disclosure will be described with reference to FIGS. 1 to 3B. FIG. 3A is a schematic sectional view of the cooling assembly A according to the first example embodiment of the present disclosure, and FIG. 3B is a schematic sectional perspective view of the cooling assembly A according to the first example embodiment of the present disclosure.

Figure 3B:
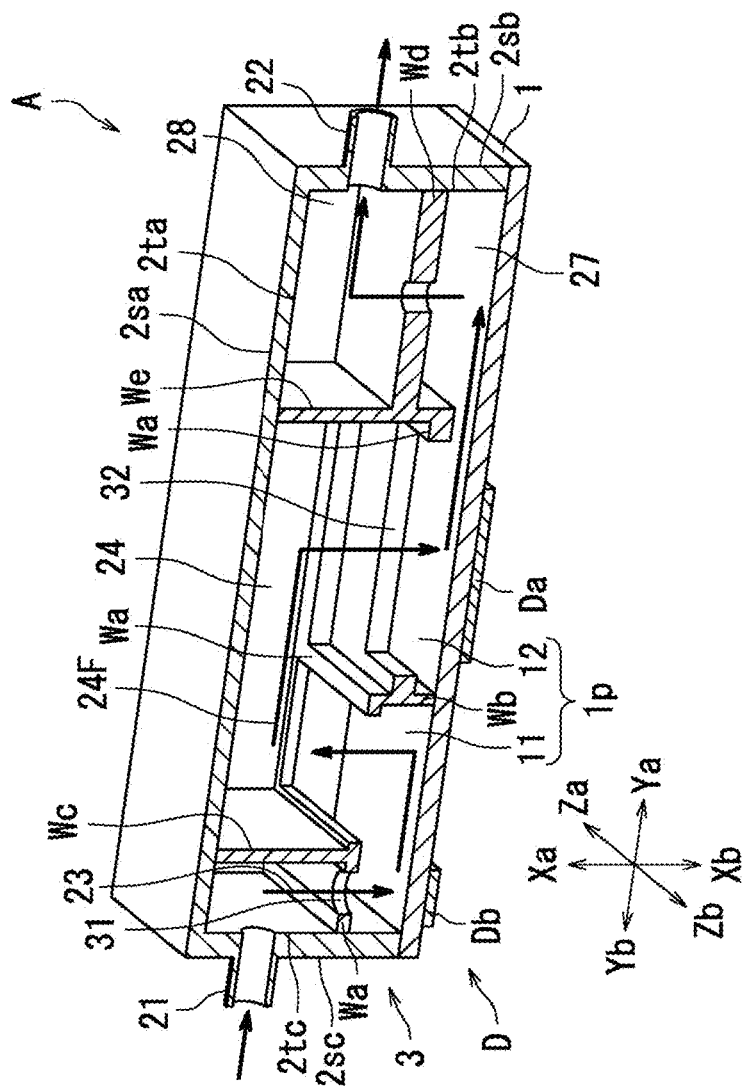
FIG. 3B is a schematic sectional perspective view of the cooling assembly according to the first example embodiment of the present disclosure.

As illustrated in FIGS. 3A and 3B, the cooling assembly A includes a cold plate 1, a housing 2, and a partition 3. The housing 2 is disposed on the upper side Xa in the first direction of the cold plate 1.

The cold plate 1 is made of a metal having high thermal conductivity such as copper or aluminum. In the present example embodiment, the cold plate 1 is a plate component in a rectangular shape expanding in the second direction Y and the third direction Z in top view. The cold plate 1 according to the present example embodiment has a quadrangular shape in top view, but is not limited thereto. For example, the cold plate 1 may have a polygonal shape having a plurality of corners or a circular shape, in top view. The heat generating component D is in contact with a lower surface of the cold plate 1.

Here, the heat generating component D includes the first heat generating component Da and the second heat generating component Db. The first heat generating component Da and the second heat generating component Db are attached to the cold plate 1. The first heat generating component Da is disposed at the center of the cold plate 1 in the second direction Y, and the second heat generating component Db is disposed on the other side Yb in the second direction of the cold plate 1.

The outer shape of the housing 2 is a substantially rectangular parallelepiped shape. Typically, the housing 2 is formed of a resin material. As a result, the housing 2 can be easily made as compared with when the housing 2 is made of metal. Additionally, even in an environment where moisture or the like adheres, the housing 2 can be prevented from rusting.

The housing 2 includes a tank chamber 24 for storing coolant. The tank chamber 24 is a recess portion formed when the housing 2 is recessed to the upper side Xa in the first direction. The tank chamber 24 is a substantially rectangular parallelepiped shape. When the cooling assembly A includes the tank chamber 24, the amount of coolant circulating in the cooling system S can be increased. For example, the coolant gradually escapes from the connection portion between the coolant pipe C and each component, and the cooling efficiency decreases when the amount of the coolant decreases. However, since the cooling assembly A includes the tank chamber 24, a decrease in cooling efficiency can be suppressed.

The housing 2 opens on the lower side Xb in the first direction. The partition 3 is located in an opening of the housing 2. That is, the partition 3 is located on the lower side Xb in the first direction of the housing 2. In the present example embodiment, the partition 3 is separate from the housing 2. By forming the partition 3 separately from the housing 2, the housing 2 can be easily formed by resin molding. However, the partition 3 may be provided together with the housing 2 in a single monolithic member.

A plate chamber 1*p* is located between the cold plate 1 and the partition 3. The cold plate 1 includes the plate chamber 1*p* in which the coolant flows between the cold plate and the partition 3. The plate chamber 1*p* includes a first plate chamber 11 and a second plate chamber 12. The partition 3 includes a partition wall (second wall Wb) extending to the lower side Xb in the first direction and being in contact with the cold plate 1. The plate chamber 1*p* is partitioned into the first plate chamber 11 and the second plate chamber 12 by the partition wall (second wall Wb). The first plate chamber 11 and the second plate chamber 12 are located in order from the other side Yb in the second direction toward the one side Ya in the second direction. That is, the first plate chamber 11 is located at a position farthest from the outflow port 22 provided in the one side Ya in the second direction.

The partition 3 has a plurality of through holes penetrating the first plate chamber 11 and the second plate chamber 12 and the housing 2. Specifically, the partition 3 includes a first through hole 31 connecting the first plate chamber 11 and a communication flow path 23 to be described later, and a second through hole 32 connecting the tank chamber 24 and the second plate chamber 12.

The partition 3 has a first wall Wa and a second wall Wb. The first wall Wa extends in the YZ plane. The first wall Wa and the cold plate 1 define the plate chamber 1*p*.

The second wall Wb extends in the X direction. The second wall Wb is connected to the first wall Wa and the cold plate 1. The plate chamber 1*p* is separated into the first plate chamber 11 and the second plate chamber 12 by the second wall Wb.

A plurality of the heat generating component D are provided, and are located to face each of the plate chambers. Each of the heat generating components D is in contact with the lower side Xb surface in the first direction of the cold plate 1. Heat of the heat generating components D is absorbed in the corresponding plate chambers.

Here, the heat generating component D includes the first heat generating component Da and the second heat generating component Db. The first heat generating component Da and the second heat generating component Db are attached to the cold plate 1. The first heat generating component Da is disposed at the center of the cold plate 1 in the second direction Y, and the second heat generating component Db is disposed on the other side Yb in the second direction of the cold plate 1. Therefore, the first heat generating component Da is disposed to face the second plate chamber 12, and the second heat generating component Db is disposed to face the first plate chamber 11.

By separating the plate chamber 1*p* into the first plate chamber 11 and the second plate chamber 12 for each heat generating component D, the coolant easily reaches the corners in the first plate chamber 11 and the second plate chamber 12. Specifically, the second plate chamber 12 to which the first heat generating component Da is attached is separated from the first plate chamber 11 to which the second heat generating component Db is attached. Therefore, it is possible to reduce stagnation of the coolant in each of the first plate chamber 11 and the second plate chamber 12. Reducing the stagnation of the coolant enables heat to be exchanged more efficiently.

The housing 2 further includes the communication flow path 23 allowing the inflow port 21 to communicate with the first through hole 31. Here, the communication flow path 23 faces the lower side Xb in the first direction.

The first through hole 31 is located substantially at the center of the first plate chamber 11. The substantial center of the first plate chamber 11 means a position at which distances between the center of the first through hole 31 and respective ends of the first plate chamber 11 in the second direction Y and/or the third direction Z are substantially equal to each other. For example, the distance from the first through hole 31 to the third inner side surface 2td is substantially equal to the distance from the first through hole 31 to the fourth inner side surface 2te. The distance from the first through hole 31 to the second inner side surface 2tc may be substantially equal to the distance from the first through hole 31 to the second wall Wb. The coolant flowing along the communication flow path 23 is bent and flows in the first plate chamber 11, and a flow path that bends toward the one side Ya in the second direction and spreads toward the third direction Z from the other side Yb in the second direction, that is, the first plate chamber 11 side is formed.

When the first through hole 31 is located at the center of the first plate chamber 11, the coolant flows and spreads throughout the first plate chamber 11 while flowing downward from the upper side Xa in the first direction to the lower side Xb in the first direction through the first through hole 31. Therefore, stagnation in the first plate chamber 11 is reduced.

The first wall Wa is provided with a large opening that connects the first plate chamber 11 and the tank chamber 24. The coolant having flowed into the first plate chamber 11 flows into the tank chamber 24 through the opening.

In the tank chamber 24, the coolant flows from the other side Yb in the second direction toward the one side Ya in the second direction. Therefore, an intermediate passage 24F of the coolant is formed in the tank chamber 24. The coolant flowing through the intermediate passage 24F flows into the second plate chamber 12 through the second through hole 32. The opening area of the second through hole 32 may be larger than the opening area of the first through hole 31. As a result, the flow rate of the coolant passing through the second through hole 32 can be made substantially equal to the flow rate of the coolant passing through the first through hole 31.

The second plate chamber 12 is located on the lower side Xb in the first direction in the tank chamber 24. The partition 3 has the second through hole 32. The second plate chamber 12 is located on the lower side Xb in the first direction of the second through hole 32. The second through hole 32 connects the tank chamber 24 and the second plate chamber 12.

In the second plate chamber 12, the coolant flows from the other side Yb in the second direction toward the one side Ya in the second direction. Therefore, a flow path of the coolant is formed in the second plate chamber 12. The coolant flowing through the second plate chamber 12 flows to a communication chamber 27 along the cold plate 1.

The communication chamber 27 is defined by a fourth wall Wd and the cold plate 1. The fourth wall Wd faces the cold plate 1 and extends in the YZ plane in parallel with the cold plate 1. The fourth wall Wd extends from the first inner side surface 2tb to the other side Yb in the second direction. In the communication chamber 27, the coolant flows from the lower side Xb in the first direction toward the upper side Xa in the first direction. The fourth wall Wd is provided with a through hole, and the coolant flows through the through hole of the fourth wall Wd and flows to an outflow chamber 28. Accordingly, a flow path of the coolant is formed in the communication chamber 27.

The outflow chamber 28 is defined by the housing 2, the fourth wall Wd, and a fifth wall We. The fifth wall We extends in the XZ plane perpendicular to the cold plate 1. The fifth wall We extends from the inner main surface 2ta to the lower side Xb in the first direction. The tank chamber 24 and the outflow chamber 28 are separated by the fifth wall We. The outflow chamber 28 is located on the upper side Xa in the first direction of the communication chamber 27. The outflow chamber 28 is connected to the outflow port 22. In the outflow chamber 28, the coolant flows from the other side Yb in the second direction toward the one side Ya in the second direction, and then flows out from the outflow port 22. Therefore, a flow path of the coolant is formed in the outflow chamber 28. The coolant flowing through outflow chamber 28 flows out from outflow port 22.

As described above, in the cooling assembly A, the coolant having flowed in from the inflow port 21 sequentially flows through the communication flow path 23, the first through hole 31, the first plate chamber 11, the intermediate passage 24F (tank chamber 24), the second through hole 32, the second plate chamber 12, the communication chamber 27, and the outflow chamber 28, and then flows out from the outflow port 22.

As described above, the cooling assembly A includes the cold plate 1, the housing 2, the first wall Wa, and the second wall Wb. The cold plate 1 is in contact with the heat generating component D. The housing 2 is disposed on one side (upper side Xa in the first direction) in the first direction with respect to the cold plate 1. The first wall Wa is located between the cold plate 1 and the housing 2. The plate chamber 1p is defined by the housing 2 and the first wall Wa. The second wall Wb separates the plate chamber 1p into the first plate chamber 11 and the second plate chamber 12 adjacent in the second direction (Y direction).

The first wall Wa has the first through hole 31 and the second through hole 32. The first through hole 31 faces the cold plate 1 in the first plate chamber 11. The second through hole 32 faces the cold plate 1 in the second plate chamber 12. Liquid flows into the first plate chamber 11 and the second plate chamber 12 adjacent to each other in the second direction (Y direction) through the first through hole 31 and the second through hole 32 facing the cold plate 1, respectively, and thus heat can be efficiently exchanged with respect to the plurality of heat generating components (for example, the first heat generating component Da and the second heat generating component Db).

The housing 2 includes the inflow port 21 into which liquid flows, the outflow port 22 from which liquid flows out, the communication flow path 23 connected to the inflow port 21, and the intermediate passage 24F connecting the first plate chamber 11 and the second plate chamber 12. The first through hole 31 connects the communication flow path 23 and the first plate chamber 11. The second through hole 32 connects the intermediate passage 24F and the second plate chamber 12.

Liquid flows into the first plate chamber 11 and the second plate chamber 12 from different flow paths through the first through hole 31 and the second through hole 32, respectively, so that heat can be efficiently exchanged with respect to the plurality of heat generating components D.

The cooling assembly A further includes a third wall Wc separating the communication flow path 23 and the intermediate passage 24F (tank chamber 24). The third wall Wc extends from the inner main surface 2ta toward the lower side Xb in the first direction.

The third wall Wc may be provided together with the housing 2 in a single monolithic member. For example, the housing 2 has the third wall Wc. In this case, since the housing 2 and the third wall Wc can be configured by one member, the number of parts can be reduced.

Alternatively, for example, the partition 3 may have the third wall Wc. For example, the first wall Wa and the third wall Wc may be provided together in a single monolithic member. In this case, since the first wall Wa and the third wall Wc can be configured by one member, the number of parts can be reduced.

Alternatively, the first wall Wa and the second wall Wb may be provided together in a single monolithic member. In this case, since the first wall Wa and the second wall Wb can be configured by one member, the number of parts can be reduced.

The first through hole 31 is located at the center in the second direction (Y direction) or at the center in the third direction (Z direction) orthogonal to the first direction and the second direction in the first plate chamber 11. The second through hole 32 is located at the center in the second direction (Y direction) or the center in the third direction (Z direction) in the second plate chamber 12. The liquid is located at the center in the second direction or the center in the third direction of the first plate chamber 11. Since the liquid flows into the first plate chamber 11 through the first through hole 31, the liquid uniformly spreads to the first plate chamber 11, so that the deviation of the heat distribution in the first plate chamber 11 can be reduced. In addition, since the liquid flows into the second plate chamber 12 through the second through hole 32 located at the center of the second plate chamber 12 in the second direction or the center of the second plate chamber 12 in the third direction, the liquid uniformly spreads to the second plate chamber 12, so that it is possible to reduce the deviation of the heat distribution in the second plate chamber 12.

Here, the lower side Xb in the first direction of the housing 2 is open, and the cold plate 1 entirely covers the opening of the housing 2, but the present example embodiment is not limited thereto. The housing 2 has a partial surface on the lower side Xb in the first direction, and the cold plate 1 may partially cover the housing 2. In this case, the cold plate 1 may be separated into a plurality of portions. For example, the cold plate 1 may be separated into a portion to which the first heat generating component Da is attached and a portion to which the second heat generating component Db is attached.

In the cooling assembly A according to the first example embodiment illustrated in FIGS. 3A and 3B, the first plate chamber 11 and the tank chamber 24 are connected by a large opening, but the present example embodiment is not limited thereto. The first plate chamber 11 and the tank chamber 24 may be connected by a through hole. In the cooling assembly A according to the first example embodiment, the cold plate 1 has a flat plate shape, but the present example embodiment is not limited thereto. The cold plate 1 may have fins.

Figure 4A:
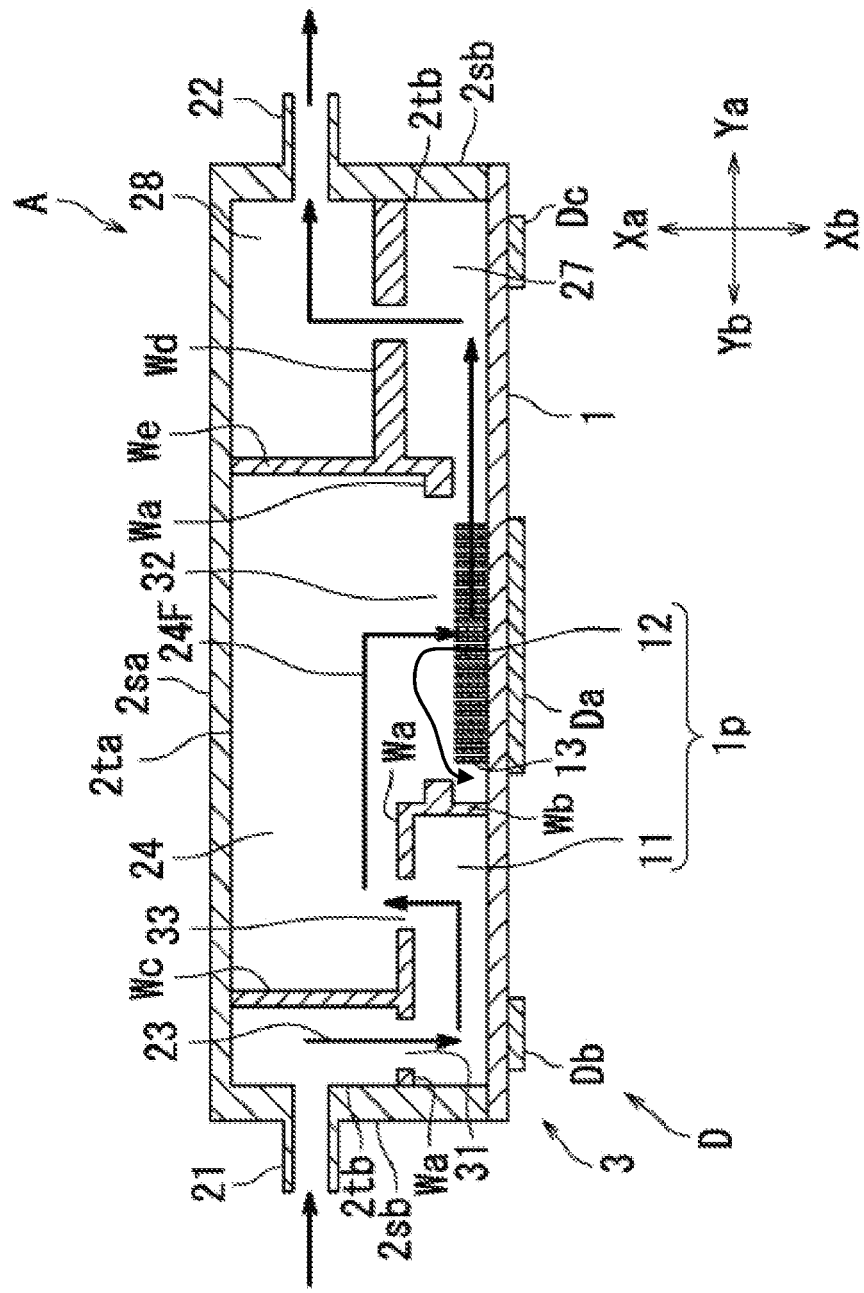
FIG. 4A is a sectional view of the cooling assembly according to a second example embodiment of the present disclosure.
Figure 4B:
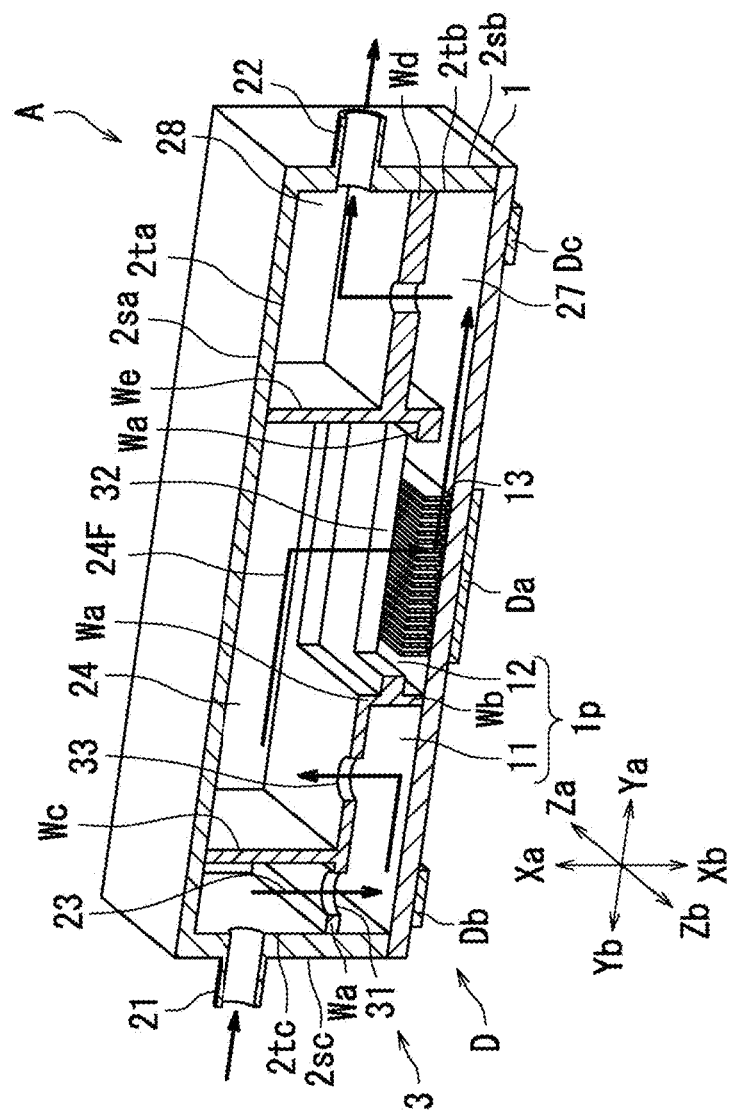
FIG. 4B is a schematic sectional perspective view of the cooling assembly according to the second example embodiment of the present disclosure.

Next, the cooling assembly A according to a second example embodiment of the present disclosure will be described with reference to FIGS. 4A to 5B. FIG. 4A is a schematic sectional view of the cooling assembly A according to the second example embodiment of the present disclosure, and FIG. 4B is a schematic sectional perspective view of the cooling assembly A according to the second example embodiment of the present disclosure. The cooling assembly A illustrated in FIGS. 4A and 4B has a configuration similar to that of the cooling assembly A according to the first example embodiment described with reference to FIGS. 3A and 3B, except that a third through hole 33 connecting the first plate chamber 11 and the tank chamber 24 is provided, the cold plate 1 has a fin 13, and a third heat generating component Dc is further attached to the cold plate 1, and redundant description is omitted in order to avoid redundancy.

As illustrated in FIGS. 4A and 4B, the third through hole 33 is provided in the partition 3. The third through hole 33 connects the first plate chamber 11 and the tank chamber 24. The opening area of the third through hole 33 is preferably substantially equal to the opening area of the first through hole 31. As a result, the flow rate of the coolant passing through the third through hole 33 can be made substantially equal to the flow rate of the coolant passing through the first through hole 31.

The heat generating component D further includes the third heat generating component Dc in addition to the first heat generating component Da and the second heat generating component Db. The first heat generating component Da is disposed at the center of the cold plate 1 in the second direction Y, and the second heat generating component Db is disposed on the other side Yb in the second direction of the cold plate 1. The third heat generating component Dc is disposed on one side Ya in the second direction of the cold plate 1.

The first heat generating component Da is disposed to face the second plate chamber 12, the second heat generating component Db is disposed to face the first plate chamber 11, and the third heat generating component Dc is disposed to face the communication chamber 27.

The cold plate 1 includes a plurality of fins 13 protruding toward the housing 2. The fins 13 are formed by a method called skive fining in which the metal material of the cold plate 1 is shaved off to be erected. In this case, the fin 13 is provided together with the cold plate 1 in a single monolithic member. However, the fin 13 may be a member different from the cold plate 1.

When the coolant flows between the fins 13, heat absorbed by the cold plate 1 can be more efficiently exchanged with the coolant. Thus, when the heat generating component D is brought into contact with the cold plate 1 on a side opposite a side where the fins 13 are located, the heat generating component D having a larger heating value can be heat exchanged with the cold plate 1 more efficiently.

The second through hole 32 is provided at a position overlapping the fins 13 in the first direction X. As described above, since the plurality of fins 13 are provided upright in the first direction X, the coolant preferably flows from the upper side Xa in the first direction toward the lower side Xb in the first direction.

The second through hole 32 extends in the second direction Y, and the plurality of fins 13 are disposed to extend in the third direction Z. Since the fins 13 each have a shape extending in the third direction Z, the coolant once flows in the third direction Z and flows to an end of the second plate chamber 12. Thereafter, the flow of the coolant flows to the one side Ya in the second direction. When the second through hole 32 is formed to extend in the second direction Y, the coolant also flows to the other side Yb in the second direction of the second plate chamber 12, thereby enabling stagnation of the coolant in the second plate chamber 12 to be reduced.

In the present example embodiment, the heat generating component D having a higher amount of heat is desirably disposed on the lower side Xb in the first direction of the second plate chamber 12 including the fins 13. However, when each of the multiple heat generating components D generates a large amount of heat, the fins 13 may be provided in the first plate chamber 11. Here, a plurality of heat generating components D serving as the heat source has been exemplified, but the arrangement and the number thereof are not limited, and may be appropriately arranged.

The cooling assembly A includes the third wall Wc that separates the communication flow path 23 and the intermediate passage 24F. For example, the housing 2 has the third wall Wc. The first wall Wa further includes the third through hole 33 located between the second wall Wb and the third wall Wc in the second direction (Y direction). The liquid flowing in from the inlet flows through the communication flow path 23, the first through hole 31, the first plate chamber 11, the third through hole 33, the intermediate passage 24F, the second through hole 32, the second plate chamber 12, the communication chamber 27, and the outflow chamber 28 in order, and flows out from the outflow port 22, so that the heat generating component D can be efficiently cooled without separating the flow of the liquid flowing in from the inflow port 21.

As described above, in the cooling assembly A, the coolant having flowed in from the inflow port 21 sequentially flows through the communication flow path 23, the first through hole 31, the first plate chamber 11, the third through hole 33, the intermediate passage 24F (tank chamber 24), the second through hole 32, the second plate chamber 12, the communication chamber 27, and the outflow chamber 28, and then flows out from the outflow port 22.

Figure 5A:
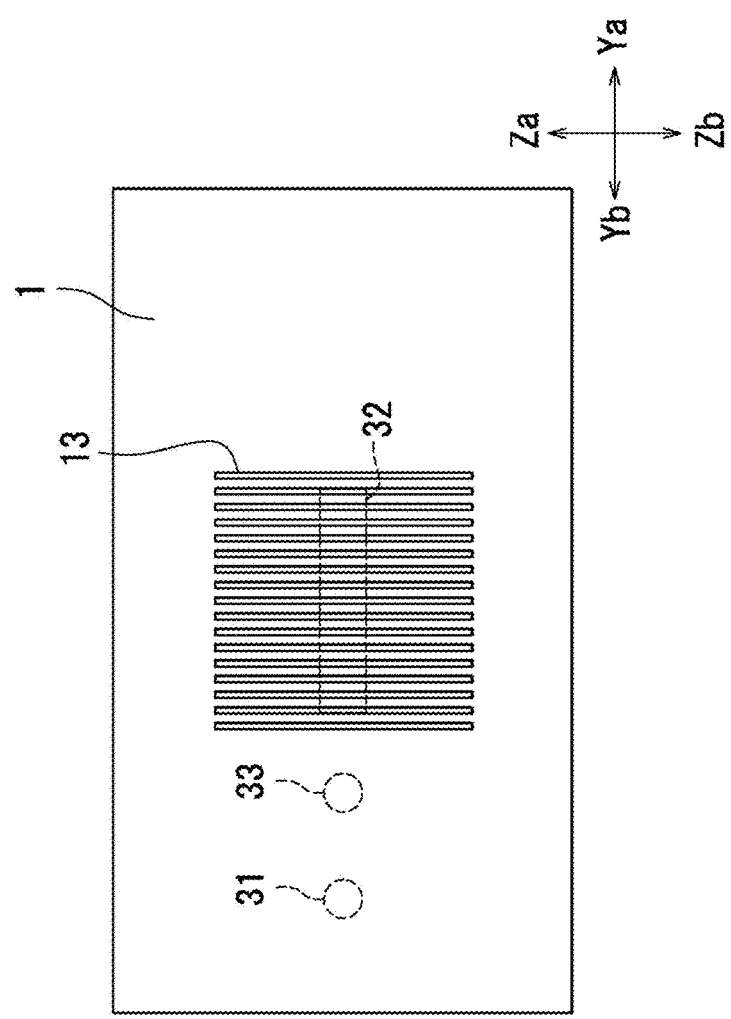
FIG. 5A is a schematic top view of a cold plate in the cooling assembly according to the second example embodiment of the present disclosure.
Figure 5B:
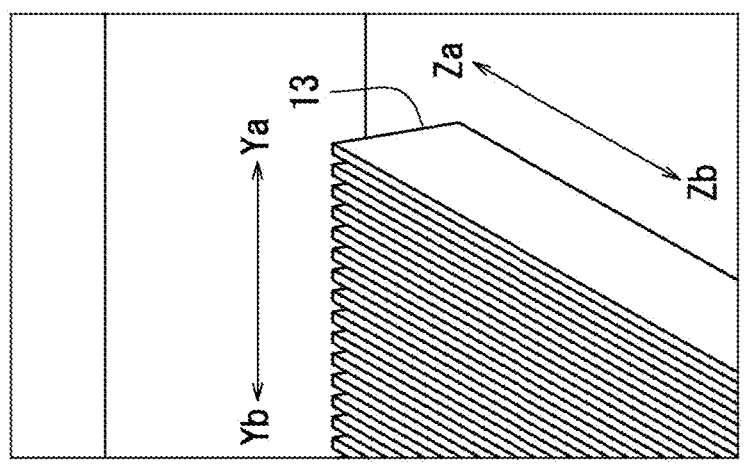
FIG. 5B is a schematic partially enlarged perspective view of the cold plate in the cooling assembly according to the second example embodiment of the present disclosure.

FIG. 5A is a schematic top view of the cold plate 1 in the cooling assembly A according to the second example embodiment of the present disclosure, and FIG. 5B is a schematic perspective view of the cold plate 1 in the cooling assembly A according to the second example embodiment of the present disclosure. FIG. 5A illustrates positions of the first through hole 31, the second through hole 32, and the third through hole 33 with respect to the cold plate 1.

As illustrated in FIGS. 5A and 5B, the cold plate 1 has a plurality of fins 13 disposed on a surface on the upper side Xa in the first direction (one side in the first direction). Here, the fin 13 is located in the first plate chamber 11, but the fin 13 may be located in at least one of the first plate chamber 11 and the second plate chamber 12. The first through hole 31 or the second through hole 32 is located on one side (upper side Xa in the first direction) in the first direction of the fin 13. Since the first through hole 31 or the second through hole 32 is located above the fin 13, the liquid flowing from one side (upper side Xa in the first direction) in the first direction to the other side (lower side Xb in the first direction) in the first direction can easily flow between the fins 13.

Here, the plurality of fins 13 are arranged in the second direction (Y direction). Specifically, the plurality of fins 13 is arranged at equal intervals along the second direction. The second through hole 32 extends in the second direction. Therefore, the liquid flowing out from the second through hole 32 can easily flow between the fins 13.

Although the cold plate 1 illustrated in FIGS. 3A to 5B is flat, the cold plate 1 may have a stepped shape.

Figure 6A:
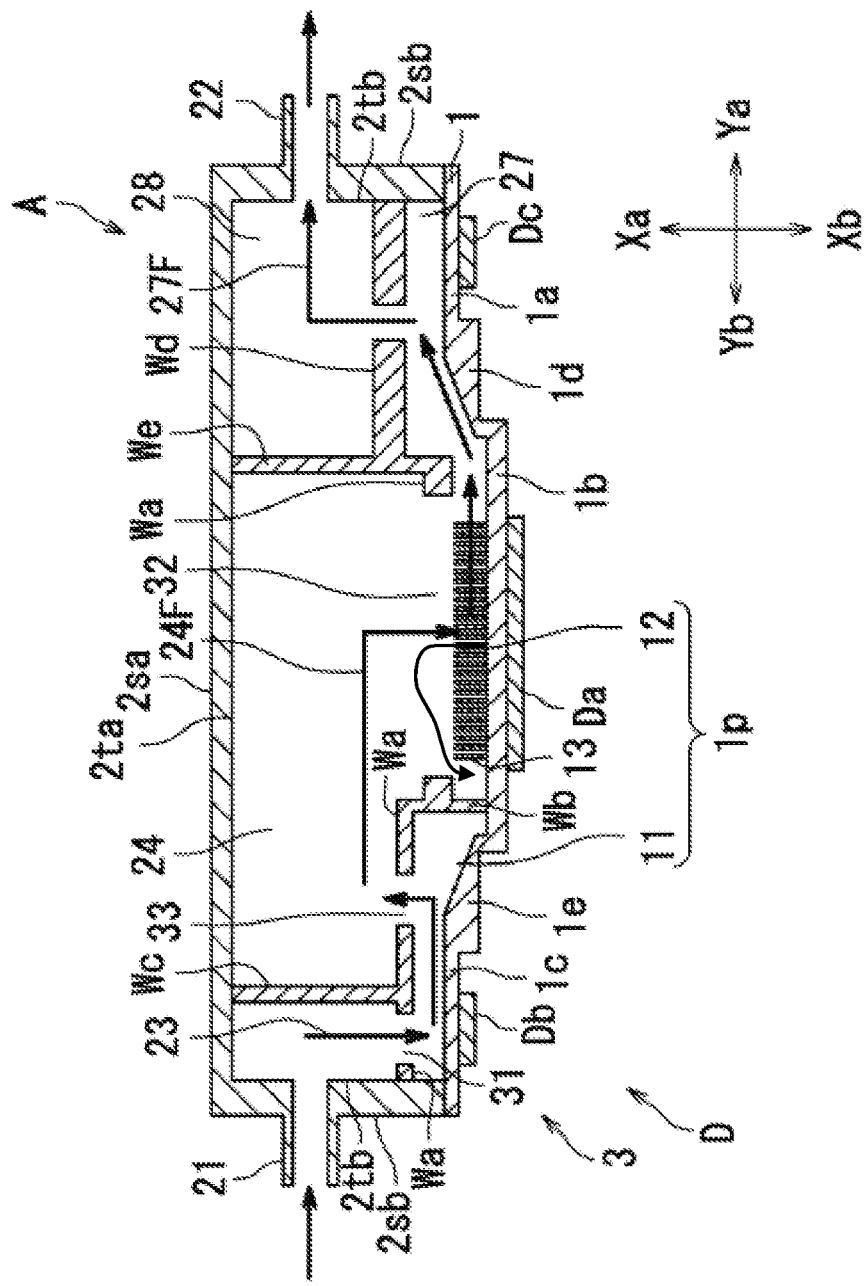
FIG. 6A is a schematic sectional view of a cooling assembly according to a third example embodiment of the present disclosure.

Next, a cooling assembly A according to a third example embodiment of the present disclosure will be described with reference to FIGS. 6A to 7B. FIG. 6A is a schematic sectional view of the cooling assembly A according to the third example embodiment of the present disclosure, and FIG. 6B is a schematic sectional perspective view of the cooling assembly A according to the third example embodiment of the present disclosure.

Figure 6B:
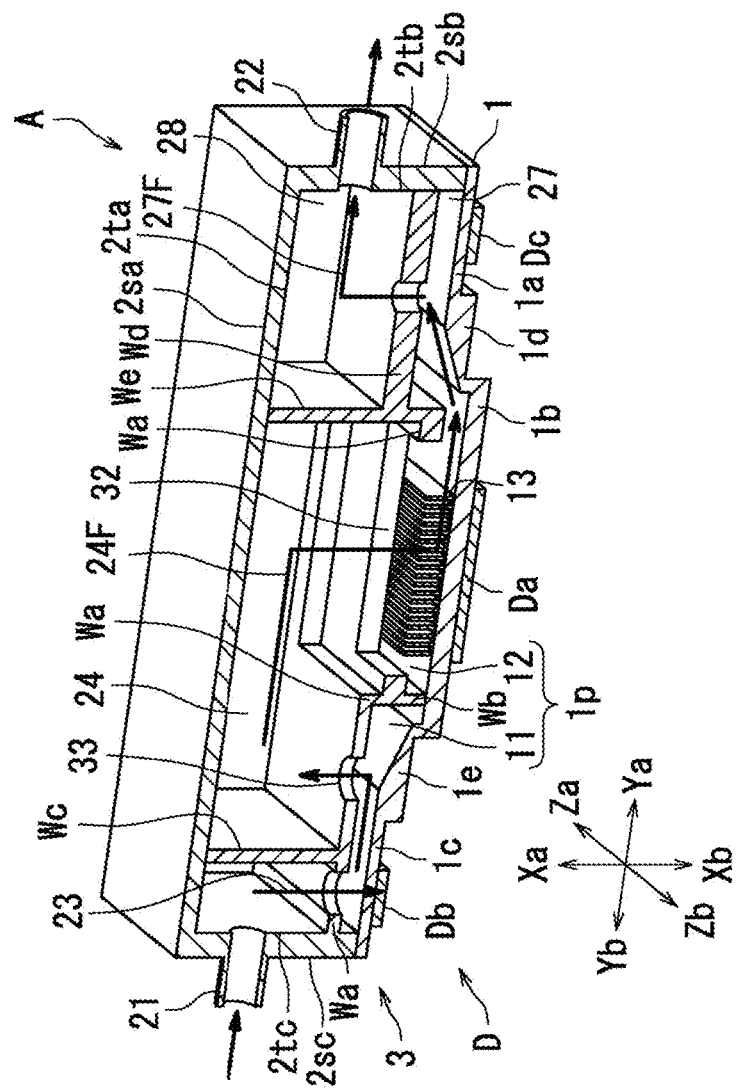
FIG. 6B is a schematic sectional perspective view of the cooling assembly according to the third example embodiment of the present disclosure.

As illustrated in FIGS. 6A and 6B, the cold plate 1 has the fins 13. The fins 13 are disposed on the upper side Xa in the first direction (one side in the first direction) of the cold plate 1.

The cold plate 1 has a stepped shape. Specifically, the cold plate 1 is recessed toward the lower side Xb in the first direction from the end portion at the center in the second direction (Y direction). The cold plate 1 includes a first end portion 1a located on one side Ya in the second direction, a central portion 1b located at the center in the second direction Y, a second end portion 1c located on the other side Yb in the second direction, a first inclined portion 1d located between the first end portion 1a and the central portion 1b, and a second inclined portion 1e located between the central portion 1b and the second end portion 1c.

Each of the first end portion 1a and the second end portion 1c is flat. The height of the first end portion 1a in the first direction (X direction) is located on the upper side Xa in the first direction with respect to the height of the central portion 1b in the first direction (X direction). The height of the second end portion 1c in the first direction (X direction) is located on the upper side Xa in the first direction with respect to the height of the central portion 1b in the first direction (X direction). The height of the first end portion 1a in the first direction (X direction) is substantially equal to the height of the second end portion 1c in the first direction (X direction). The second wall Wb is in contact with the surface of the central portion 1b on the lower side Xb in the first direction.

The fin 13 is arranged in the surface of the upper side Xa in the first direction of the central portion 1b. The height of the fin 13 in the first direction (X direction) is substantially equal to the distance between the central portion 1b and the first wall Wa or smaller than the distance between the central portion 1b and the first wall Wa.

The first heat generating component Da is located in the surface of the central portion 1b on the lower side Xb in the first direction. The second heat generating component Db is located in the surface of the second end portion 1c on the lower side Xb in the first direction. The third heat generating component Dc is located in the surface of the first end portion 1a on the lower side Xb in the first direction.

Figure 7A:
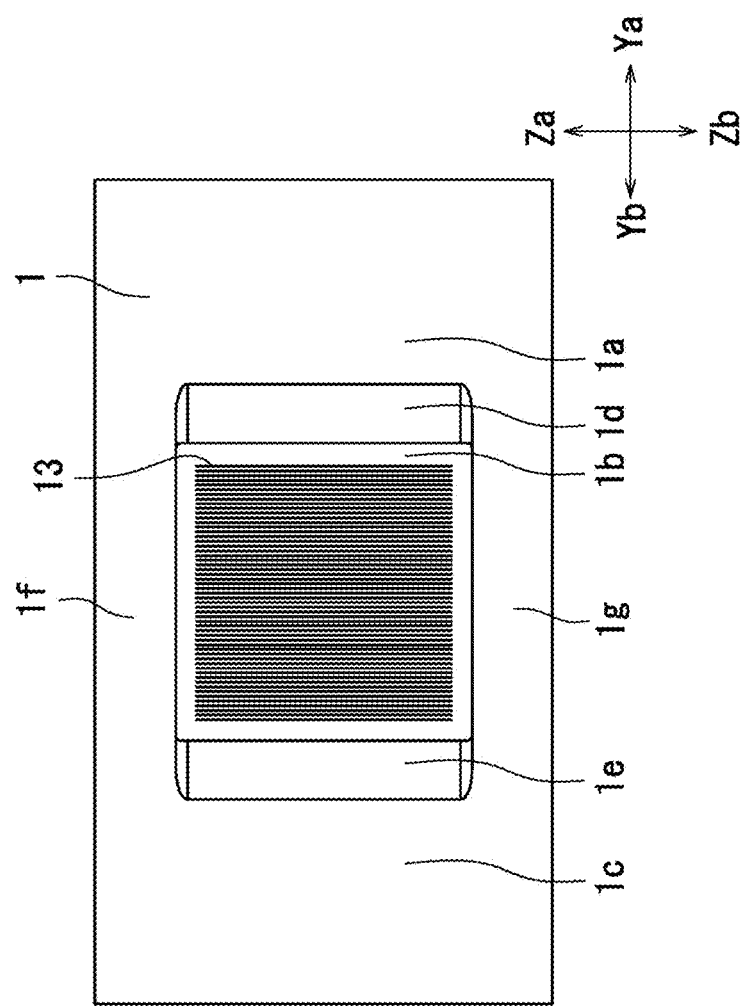
FIG. 7A is a view of the cooling assembly according to the third example embodiment of the present disclosure as viewed from above in a first direction of the cold plate.
Figure 7B:
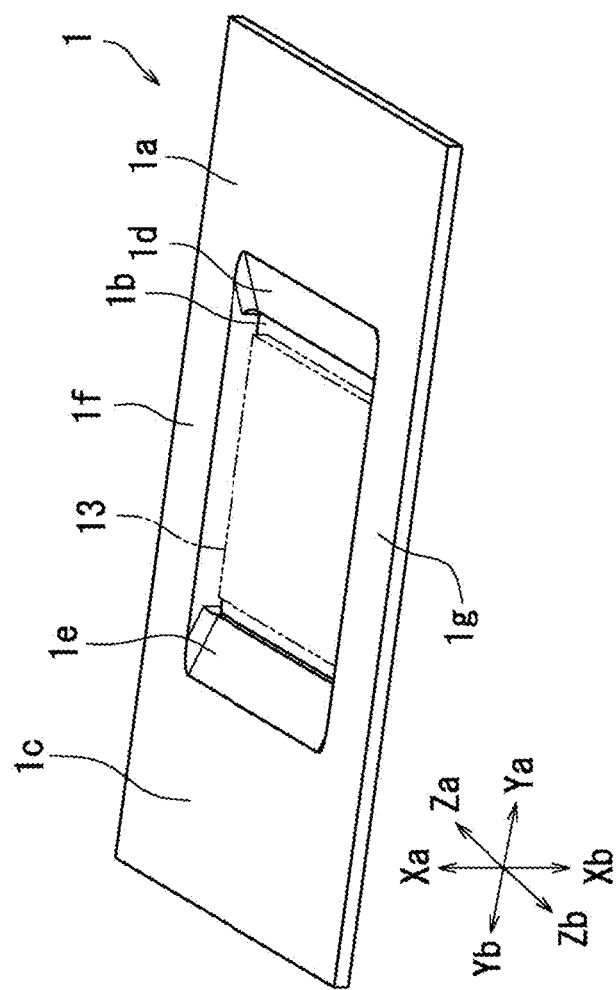
FIG. 7B is a schematic perspective view of the cold plate in the cooling assembly according to the third example embodiment of the present disclosure.

FIG. 7A is a schematic top view of the cold plate 1 in the cooling assembly A according to the third example embodiment of the present disclosure, and FIG. 7B is a schematic sectional perspective view of the cooling assembly A according to the third example embodiment of the present disclosure.

As illustrated in FIGS. 7A and 7B, the cold plate 1 includes the first end portion 1a located on one side Ya in the second direction, the central portion 1b located at the center in the second direction Y, the second end portion 1c located on the other side Yb in the second direction, the first inclined portion 1d located between the first end portion 1a and the central portion 1b, the second inclined portion 1e located between the central portion 1b and the second end portion 1c, a first peripheral portion 1f located on one side Za in the third direction, and a second peripheral portion 1g located on the other side Zb in the third direction.

The first inclined portion 1d is located between the first end portion 1a and the central portion 1b, and connects the first end portion 1a and the central portion 1b. The surface of the first inclined portion 1d on the upper side Xa in the first direction is inclined with respect to the surface of the upper side Xa in the first direction of each of the first end portion 1a and the central portion 1b.

The second inclined portion 1e is located between the central portion 1b and the second end portion 1c, and connects the central portion 1b and the second end portion 1c. The surface of the second inclined portion 1e on the upper side Xa in the first direction is inclined with respect to the surface of each of the central portion 1b and the second end portion 1c on the upper side Xa in the first direction.

The first peripheral portion 1f is located on one side Za in the third direction with respect to the first inclined portion 1d, the central portion 1b, and the second inclined portion 1e. The second peripheral portion 1g is located on the other side Zb of the third direction with respect to the first inclined portion 1d, the central portion 1b, and the second inclined portion 1e. The heights of the surfaces of the first peripheral portion 1f and the second peripheral portion 1g on the upper side Xa in the first direction are equal to the heights of the surfaces of the first end portion 1a and the second end portion 1c on the upper side Xa in the first direction. Therefore, the first end portion 1a, the second end portion 1c, the first peripheral portion 1f, and the second peripheral portion 1g constitute a plane, and this plane surrounds the first inclined portion 1d, the central portion 1b, and the second inclined portion 1e.

Since the cold plate 1 has the stepped shape, the cold plate 1 can be brought into contact with both the first heat generating component Da and the second heat generating component Db, for example, even when the positions of the first heat generating component Da and the second heat generating component Db in the first direction are different from each other.

The cooling assembly A preferably includes a pump. The coolant in the cooling assembly A can suitably flow by the pump.

Figure 8:
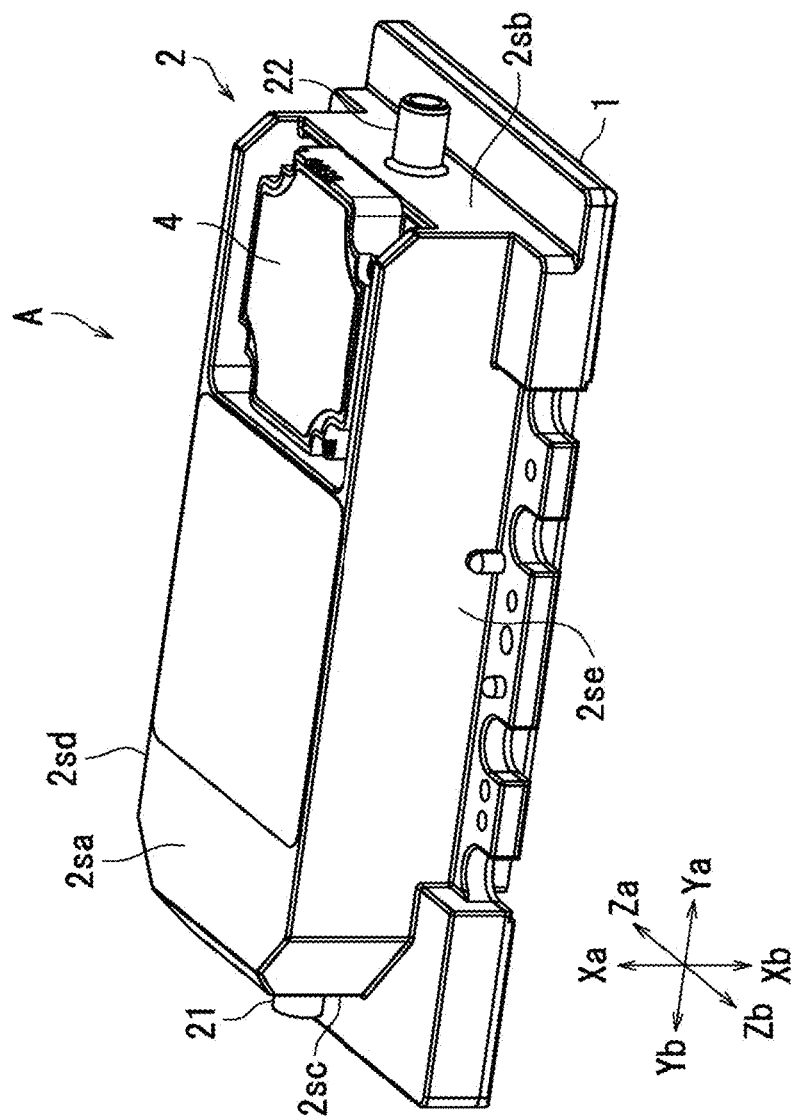
FIG. 8 is a general perspective view of a cooling assembly according to a fourth example embodiment of the present disclosure.

Next, a cooling assembly A according to a fourth example embodiment of the present disclosure will be described with reference to FIGS. 8 to 9B. FIG. 8 is a general perspective view of the cooling assembly A according to the fourth example embodiment of the present disclosure.

The cooling assembly A further includes a pump 4 in addition to the cold plate 1 and the housing 2. The housing 2 has a pump chamber 25 on one side Ya in the second direction on the outer main surface 2sa. The pump 4 is disposed in the pump chamber 25.

Figure 9A:
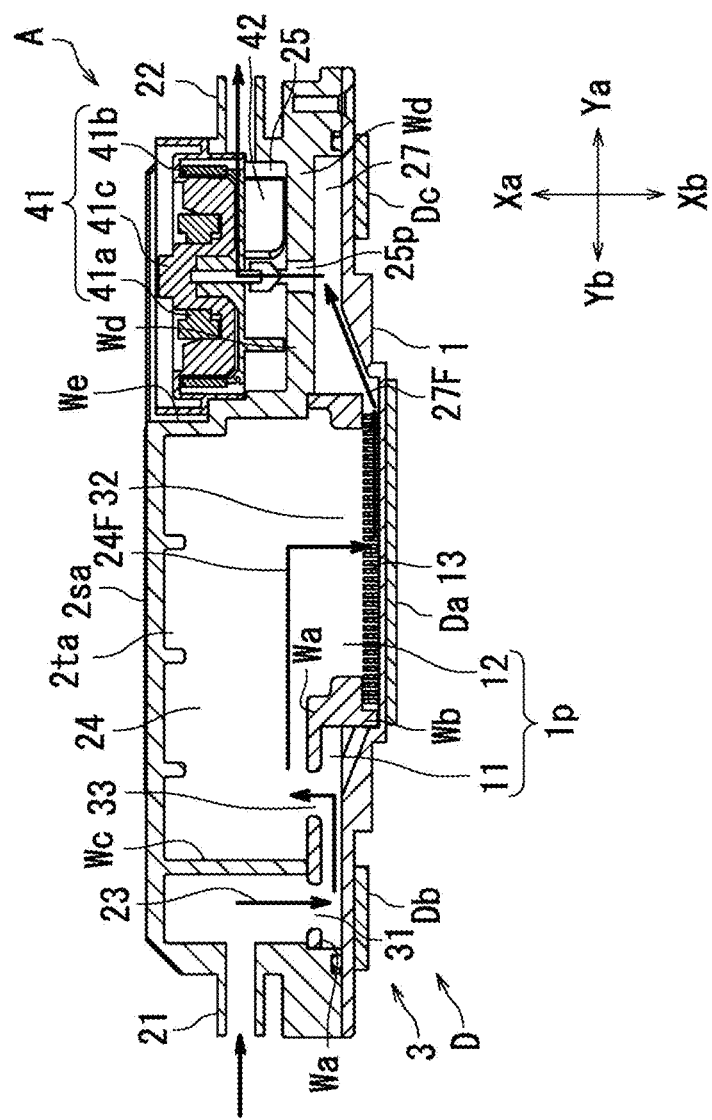
FIG. 9A is a schematic sectional view of the cooling assembly according to the fourth example embodiment of the present disclosure.
Figure 9B:
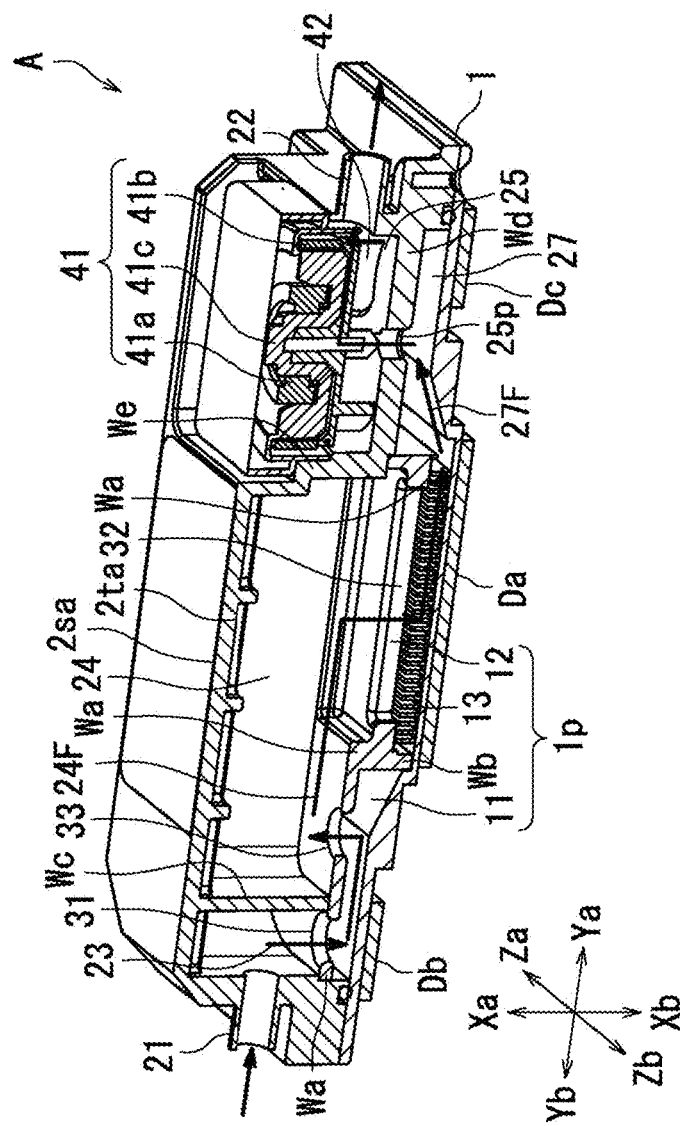
FIG. 9B is a schematic sectional perspective view of the cooling assembly according to the fourth example embodiment of the present disclosure.

FIG. 9A is a schematic sectional view of the cooling assembly A according to the fourth example embodiment of the present disclosure, and FIG. 9B is a schematic sectional perspective view of the cooling assembly A according to the fourth example embodiment of the present disclosure.

As illustrated in FIGS. 9A and 9B, the cooling assembly A includes the cold plate 1, the housing 2, the partition 3, and the pump 4. The housing 2 and the pump 4 are disposed on the upper side Xa in the first direction of the cold plate 1.

The pump 4 is preferably disposed on the downstream side of the flow path in the cooling assembly A from when the coolant flows in from the inflow port 21 to when the coolant flows out from the outflow port 22. For example, the pump 4 is preferably disposed to send out the coolant having passed through the first plate chamber 11 and the second plate chamber 12.

When air enters the coolant, the ability of the pump 4 to circulate the coolant into the cooling system S decreases. When the coolant is stored in the tank chamber 24, the amount of coolant for maintaining the cooling efficiency of the cooling system S can be secured. Additionally, even when air enters the cooling system S, the air can be stored in the tank chamber 24. This enables preventing deterioration in the ability to circulate the coolant due to the ingress of air into the pump 4.

The cooling assembly A includes the pump 4 and the fourth wall Wd. The pump 4 includes a motor 41 and an impeller 42. The motor 41 includes a stator 41a, a rotor 41b, and a casing 41c. The stator 41a is disposed in the casing 41c. The rotor 41b is formed integrally with the impeller 42. The pump chamber 25 is defined by the fourth wall Wd and the casing 41c. The impeller 42 is housed in the pump chamber 25. The housing 2 has a pump inflow side flow path 27F connecting the second plate chamber 12 and the pump chamber 25. The fourth wall Wd has a suction port 25p connecting the pump inflow side flow path 27F and the pump chamber 25. In the cooling assembly A according to the fourth example embodiment of the present disclosure, the fourth wall Wd is a part of the housing 2, and the pump chamber 25 is defined by the housing 2 and the casing 41c.

The pump chamber 25 is provided on one side Ya in the second direction with respect to the tank chamber 24. The housing 2 has an outflow port 22. The outflow port 22 is connected to one side Ya in the second direction of the pump chamber 25. The coolant flows from the plate chamber 1p into the pump chamber 25 through the suction port 25p. The pump 4 is a centrifugal pump, and sucks up the coolant in the plate chamber 1p through the suction port 25p in the first direction X to feed the coolant toward the outflow port 22.

Since the liquid flowing in from the inflow port 21 passes through the plurality of flow paths before reaching the pump chamber 25, it is possible to suppress the impeller 42 from immediately idling even when air flows in together with the liquid.

The second through hole 32 extends in the second direction Y, and the plurality of fins 13 are disposed to extend in the third direction Z. When the fins 13 each have a shape extending in the third direction Z, the coolant once flows in the third direction Z and flows to an end of the second plate chamber 12. The pump 4 is located on one side Ya in the second direction, so that the coolant flows to the one side Ya in the second direction. When the second through hole 32 is formed to extend in the second direction Y, the coolant also flows to the other side Yb in the second direction of the second plate chamber 12, thereby enabling stagnation of the coolant in the second plate chamber 12 to be reduced.

In the description with reference to FIGS. 1 to 9, the inflow port 21 is located on the other side Yb in the second direction of the housing 2, and the outflow port 22 is located on one side Ya in the second direction of the housing 2, but the present example embodiment is not limited thereto. Both the inflow port 21 and the outflow port 22 may be disposed in one of the one side Ya in the second direction and the other side Yb in the second direction of the housing 2.

Figure 10:
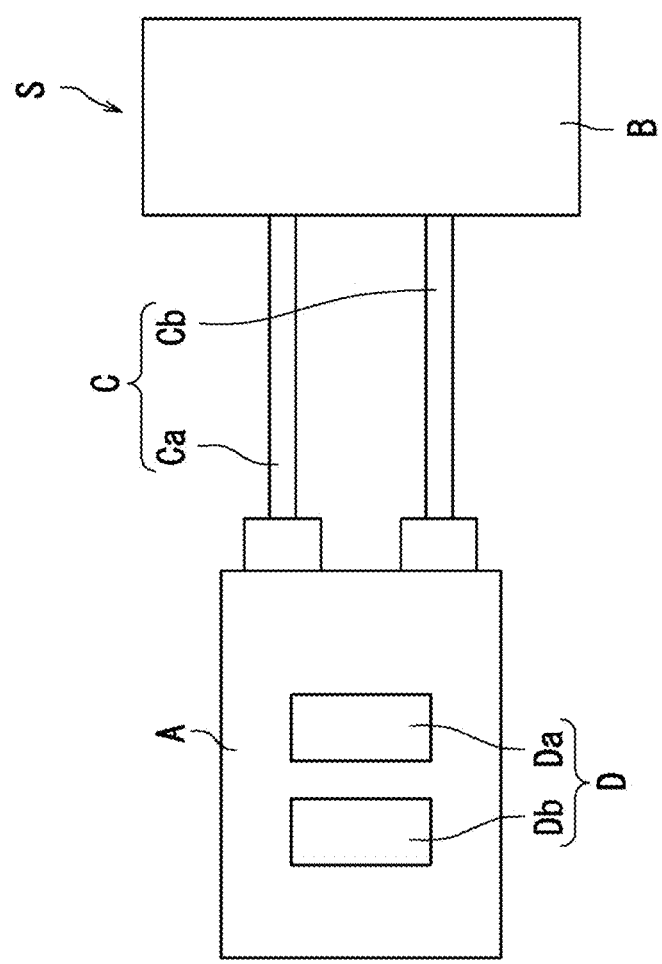
FIG. 10 is a schematic view of a cooling system equipped with a cooling assembly according to an example embodiment of the present disclosure.

Next, the cooling system S on which the cooling assembly A of the present disclosure is mounted will be described with reference to FIGS. 10 and 11. FIG. 10 is a schematic view of a cooling system equipped with a cooling assembly of the present disclosure.

As illustrated in FIG. 10, the housing 2 includes the inflow port 21 through which the coolant flows into the housing 2, and the outflow port 22 through which the coolant flows out of the housing 2. The coolant pipe C is attached to each of the inflow port 21 and the outflow port 22. The inflow port 21 and the outflow port 22 are provided on one side Ya in the second direction. By providing the inflow port 21 and the outflow port 22 at the same direction position, the length of the cooling assembly A along the second direction Y can be shortened.

The inflow port 21 and the outflow port 22 are located on one side Ya in the second direction with respect to the housing 2. Accordingly, the inflow port 21 and the outflow port 22 of the cooling assembly A can be concentrated on one side.

Figure 11:
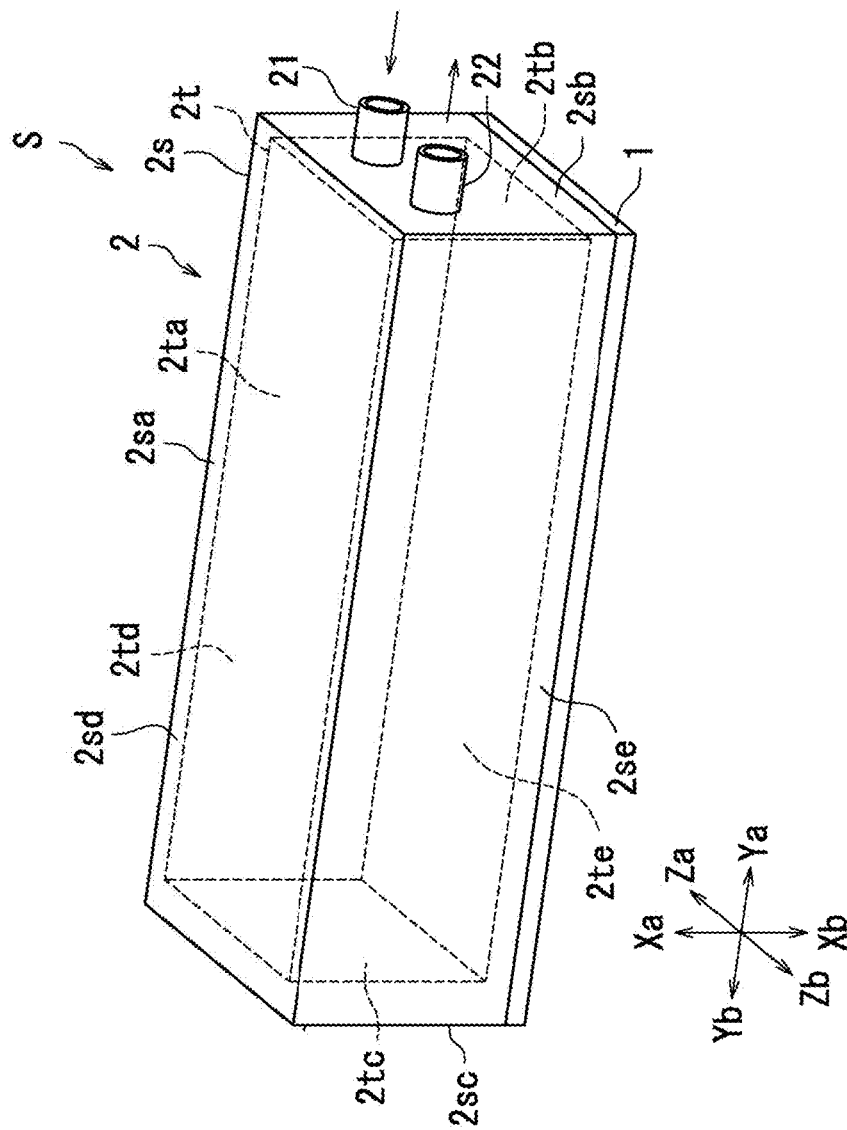
FIG. 11 is a general perspective view of a cooling assembly according to a fifth example embodiment of the present disclosure.

FIG. 11 is a general perspective view of a cooling assembly A according to a fifth example embodiment of the present disclosure. As illustrated in FIG. 11, the inflow port 21 and the outflow port 22 are located in the first outer side surface 2sb of the housing 2. The inflow port 21 and the outflow port 22 connect the first outer side surface 2sb and the first inner side surface 2tb of the housing 2.

As described above, in the cooling assembly A, the inflow port 21 and the outflow port 22 may be located in the same direction. Also in this case, the cooling assembly A preferably includes a pump.

Figure 12:
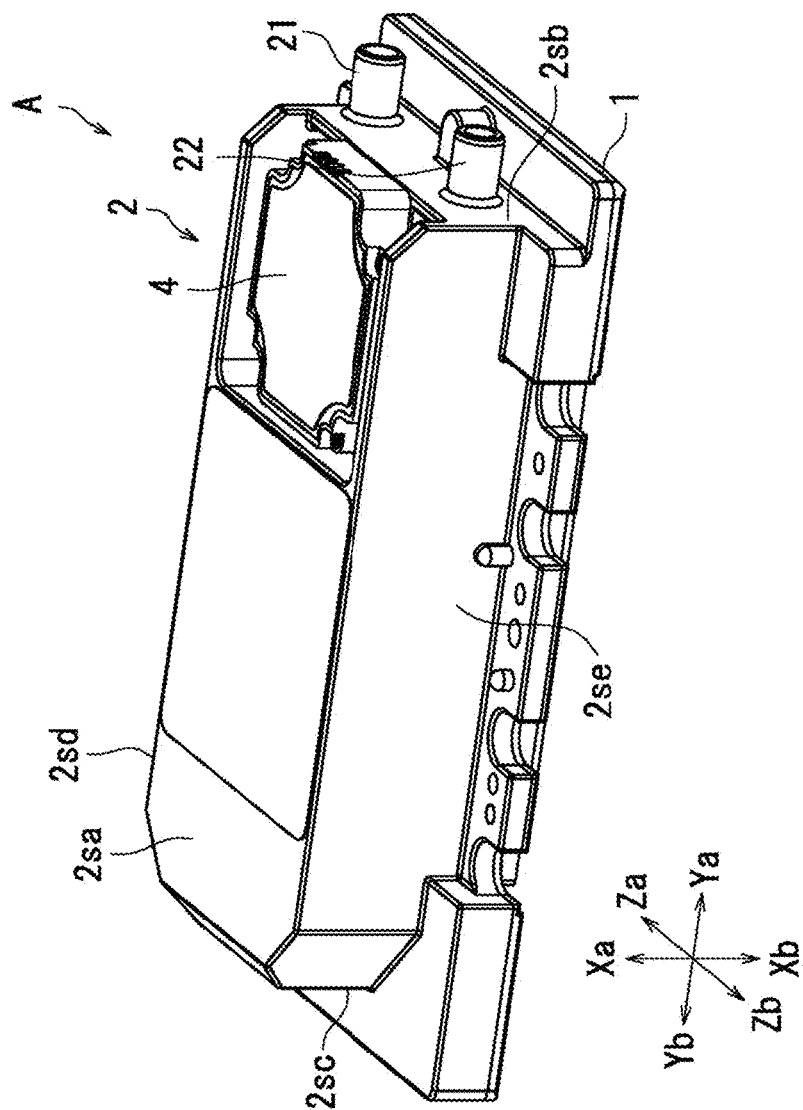
FIG. 12 is a general perspective view of a cooling assembly according to a sixth example embodiment of the present disclosure.

Next, a cooling assembly A according to a sixth example embodiment of the disclosure will be described with reference to FIGS. 12 to 15. FIG. 12 is a general perspective view of the cooling assembly A according to the sixth example embodiment of the present disclosure.

As illustrated in FIG. 12, the cooling assembly A includes the cold plate 1, the housing 2, and the pump 4. The housing 2 has an inflow port 21 and an outflow port 22. The inflow port 21 and the outflow port 22 are disposed on one side Ya in the second direction. The housing 2 has the pump chamber 25 on one side Ya in the second direction. The pump 4 is disposed in the pump chamber 25.

By providing the inflow port 21 and the outflow port 22 at the same direction position, the length of the cooling assembly A along the second direction Y can be shortened. If the first plate chamber 11 and the second plate chamber 12 are large plate chambers connected from one side Ya in the second direction to the other side Yb in the second direction, a portion corresponding to the first plate chamber 11 is away from the inflow port 21. This slows a flow of the coolant, so that the coolant tends to stagnate in the first plate chamber 11. The pump 4 is also provided on the one side Ya in the second direction of the housing 2 and is located away from the first plate chamber 11. This causes the coolant to circulate near the pump 4, so that the coolant is less likely to flow and is likely to stagnate at a position away from the pump 4.

However, in the cooling assembly A of the present example embodiment, by isolating the plate chamber 1p for each of the heat generating components D, accumulation of the coolant is reduced. When the inflow port 21 communicates with the first through hole 31, i.e., when the first plate chamber 11 farthest from the inflow port 21 and the outflow port 22 is provided with the communication flow path 23 that first communicates with the inflow port 21, the stagnation of the coolant in the first plate chamber 11 can be reduced. This enables maintaining heat exchange efficiency of the heat generating component D disposed closer to the first plate chamber 11.

Figure 13A:
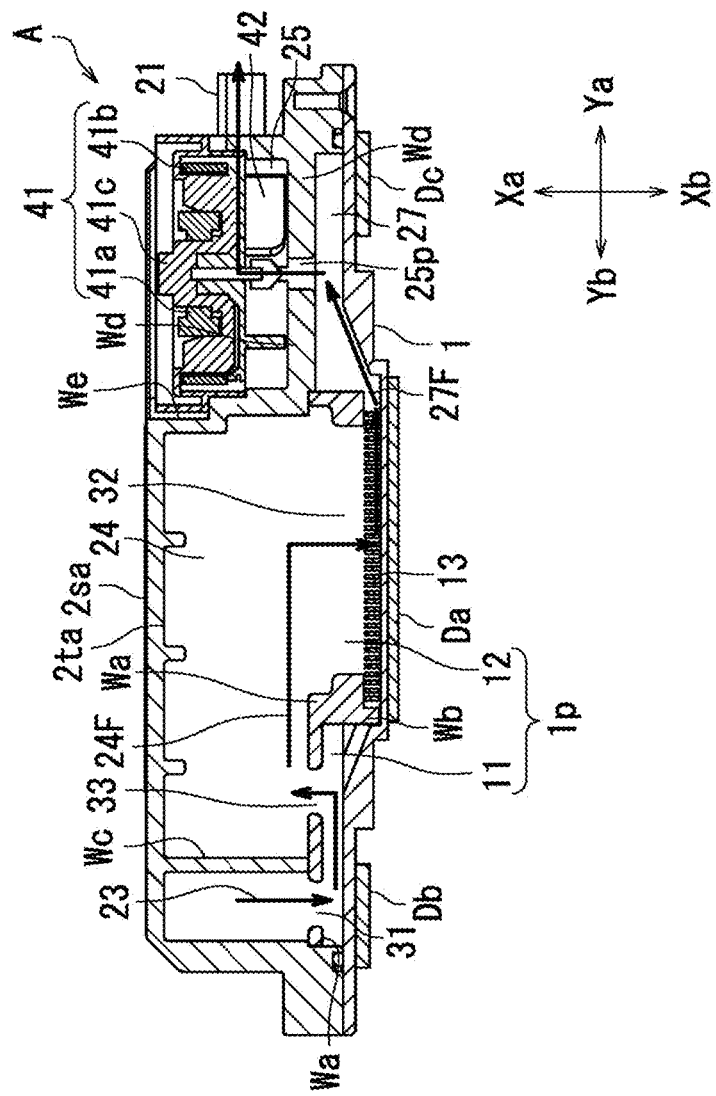
FIG. 13A is a sectional view of the cooling assembly according to the sixth example embodiment of the present disclosure.
Figure 13B:
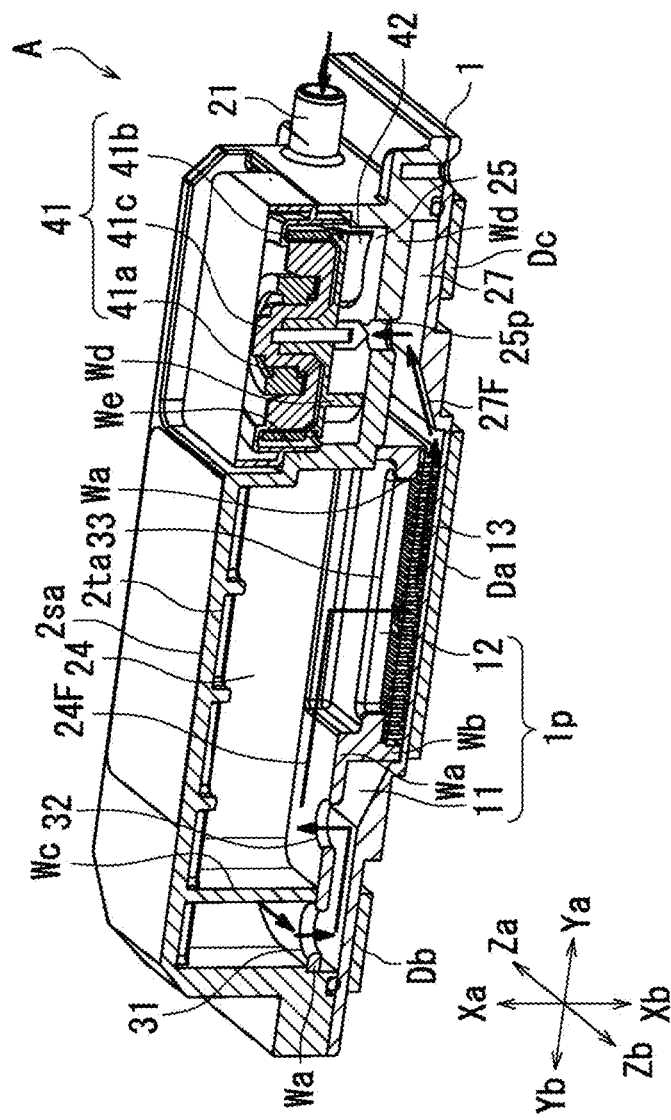
FIG. 13B is a schematic sectional perspective view of the cooling assembly according to the sixth example embodiment of the present disclosure.

FIG. 13A is a sectional view of the cooling assembly A according to the sixth example embodiment of the present disclosure, and FIG. 13B is a schematic sectional perspective view of the cooling assembly A according to the sixth example embodiment of the present disclosure.

As illustrated in FIGS. 13A and 13B, the inflow port 21 is connected to the communication flow path 23. The coolant having flowed in from the inflow port 21 flows into the communication flow path 23, passes through the first through hole 31, and flows into the first plate chamber 11.

The communication flow path 23 bypasses the tank chamber 24 and extends from the one side Ya in the second direction to the other side Yb in the second direction. More specifically, the communication flow path 23 is located in one size Za in the third direction of the tank chamber 24. Accordingly, the coolant flows through the inflow port 21, the communication flow path 23, the first through hole 31, the first plate chamber 11, the third through hole 33, the tank chamber 24 (intermediate passage 24F), the second through hole 32, the second plate chamber 12, the communication chamber 27 (pump inflow side flow path 27F), the pump chamber 25, and the outflow port 22 in this order.

Figure 14:
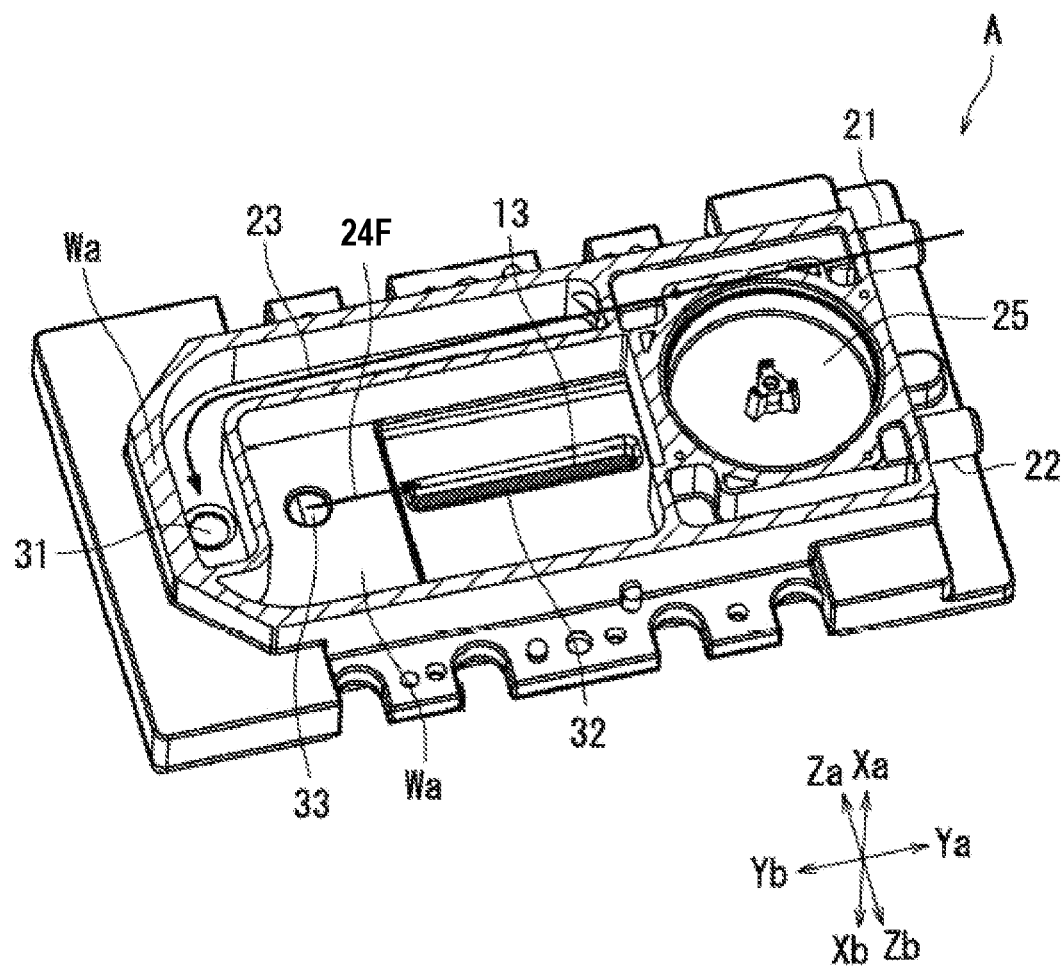
FIG. 14 is a schematic sectional perspective view of the cooling assembly according to the sixth example embodiment of the present disclosure.

FIG. 14 is a schematic sectional perspective view of the cooling assembly A according to the sixth example embodiment of the present disclosure. As illustrated in FIG. 14, the inflow port 21 is connected to the communication flow path 23 located in one side Za in the third direction with respect to the tank chamber 24, and is connected to the first through hole 31 located on one side Ya in the second direction.

The pump 4 is disposed on one side Ya of the second direction of the cooling assembly A. The coolant flows through the inflow port 21, the communication flow path 23, the first through hole 31, the first plate chamber 11, the third through hole 33, the intermediate passage 24F, the second through hole 32, the second plate chamber 12, the pump inflow side flow path 27F, the pump chamber 25, and the outflow port 22 in this order. The communication flow path 23 bypasses the intermediate passage 24F and extends from one side Ya in the second direction to the other side Yb in the second direction.

In a case where the pump 4, the inflow port 21, and the outflow port 22 are provided in the one side Ya in the second direction, the coolant circulates on one side Ya in the second direction and stays on the other side unless the communication flow path 23 makes a detour. In the cooling assembly A of the present example embodiment, the coolant once flows through the communication flow path 23 from one side Ya in the second direction to the other side Yb in the second direction, and then flows from the other side Yb in the second direction to one side Ya in the second direction, whereby the coolant can flow throughout the cooling assembly A.

Figure 15:
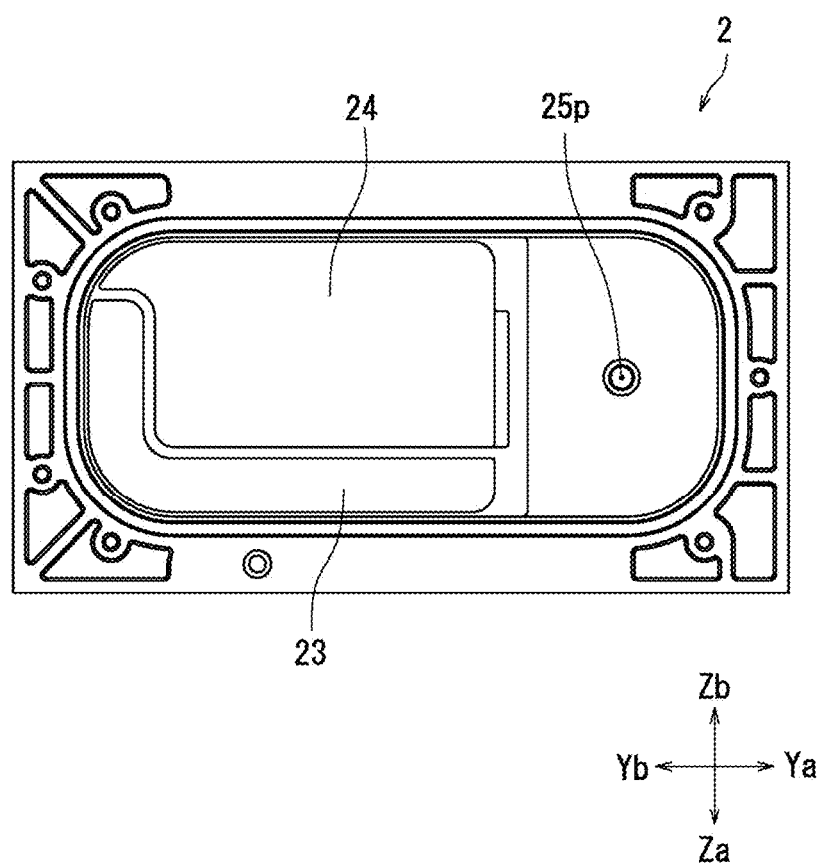
FIG. 15 is a schematic view of the inside of a housing in the cooling assembly according to the sixth example embodiment of the present disclosure.

FIG. 15 is a view of the inside of the housing 2 in the cooling assembly A according to the sixth example embodiment of the present disclosure. As illustrated in FIG. 15, the housing 2 has the communication flow path 23 in the other side Yb in the second direction and one side Za in the third direction. The housing 2 has the tank chamber 24 in the other side Zb in the third direction with respect to the communication flow path 23.

Figure 16:
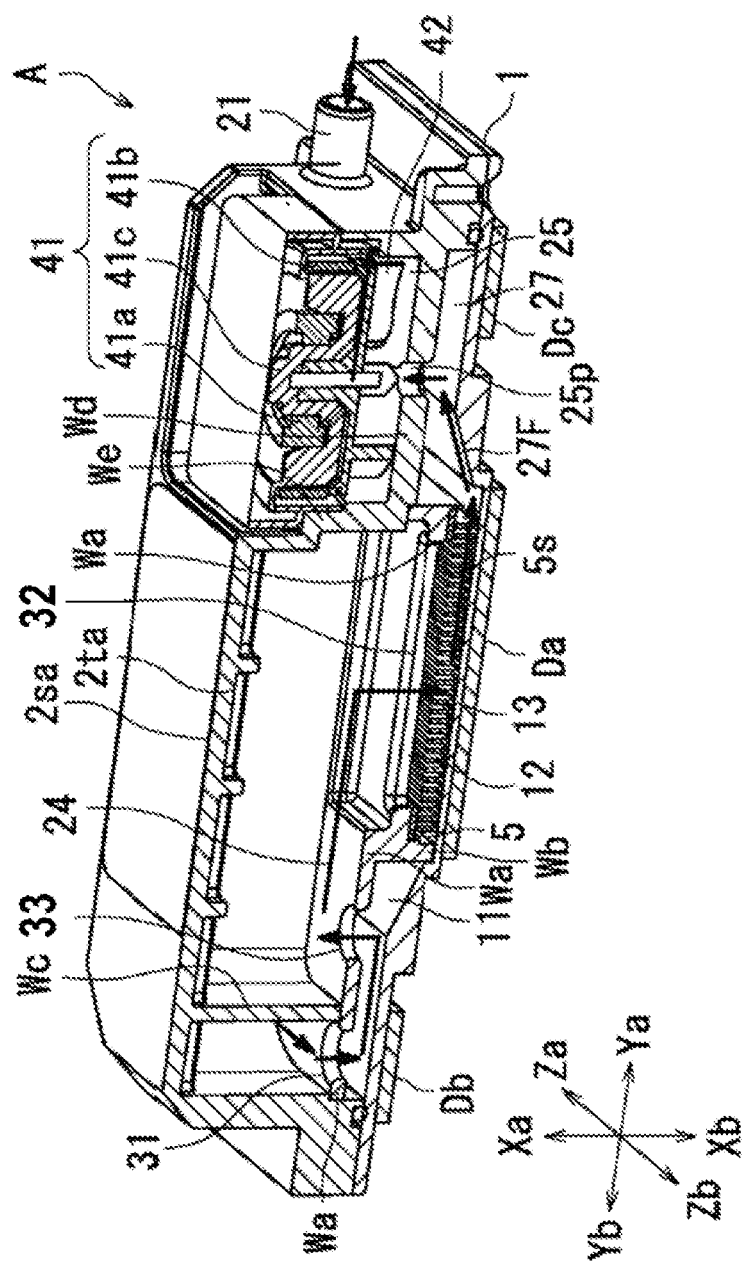
FIG. 16 is schematic sectional perspective view of a cooling assembly according to a seventh example embodiment of the present disclosure.

Next, a cooling assembly A according to a seventh example embodiment of the present disclosure will be described with reference to FIGS. 16 to 18. FIG. 16 is a sectional view of the cooling assembly A according to the seventh example embodiment of the present disclosure. The cooling assembly A according to the seventh example embodiment illustrated in FIG. 16 has the same configuration as the cooling assembly A according to the sixth example embodiment described above with reference to FIG. 13B except that the elastic members 5 are disposed between the first wall Wa and the fins 13 of the cold plate 1, and redundant description will be omitted in order to avoid redundancy.

Figure 18:
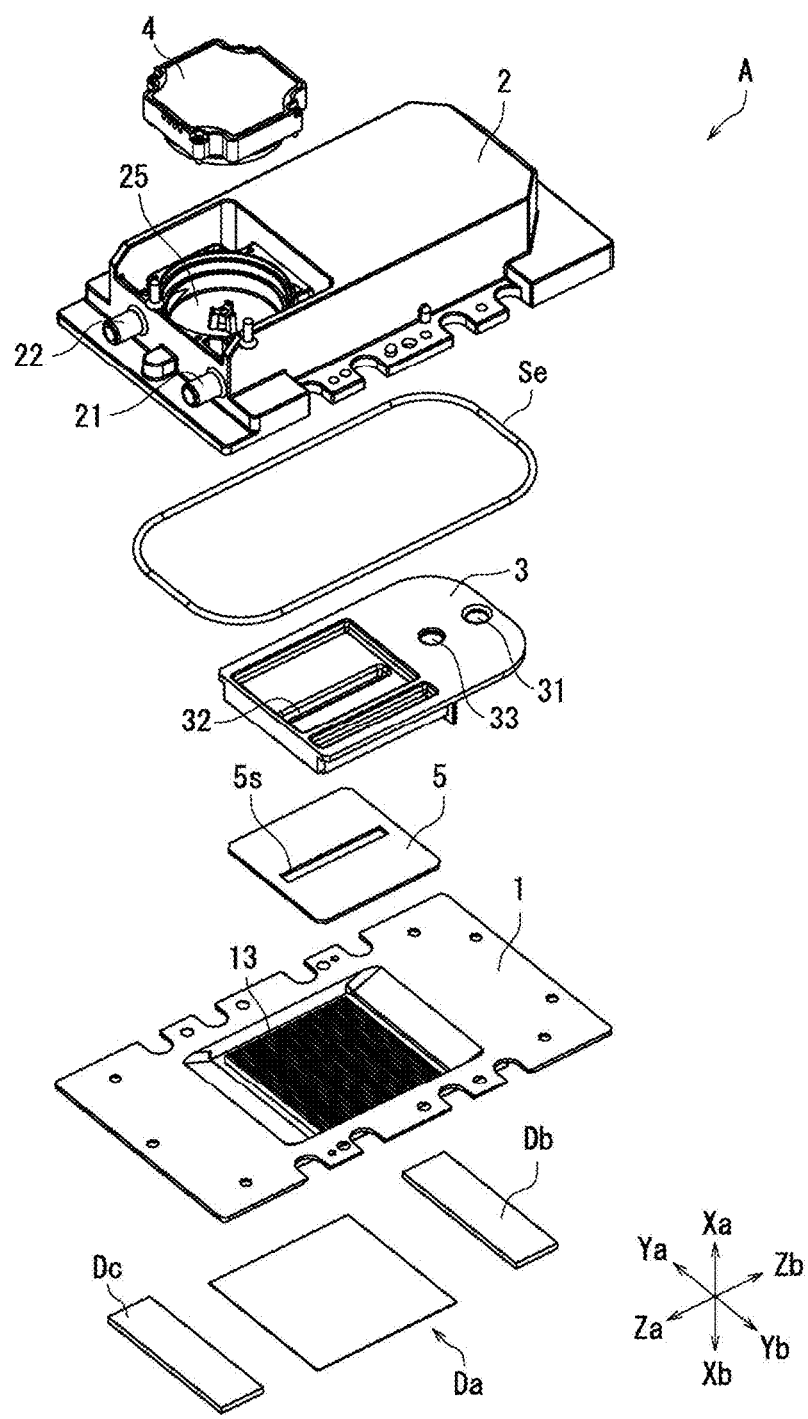
FIG. 18 is a schematic exploded perspective view of the cooling assembly according to the seventh example embodiment of the present disclosure.

As illustrated in FIGS. 16 and 18, the elastic member 5 is disposed between the first wall Wa and the fins 13 of the cold plate 1. The elastic member 5 has a plate shape. The elastic member 5 is provided with a slit 5s. The slit 5s extends in the second direction (Y direction) similarly to the second through hole 32 of the first wall Wa. The slit 5s overlaps the second through hole 32 of the first wall Wa. The size of the slit 5s is the same as the size of the second through hole 32 of the first wall Wa. As a result, the coolant in the tank chamber 24 flows into the second plate chamber 12 through the second through hole 32 of the first wall Wa and the slit 5s of the elastic member 5. By disposing the elastic member 5 in contact with the fin 13 between the first wall Wa and the fin 13 of the cold plate 1, it is possible to more positively flow the coolant into the gap between the fins 13.

Figure 17A:
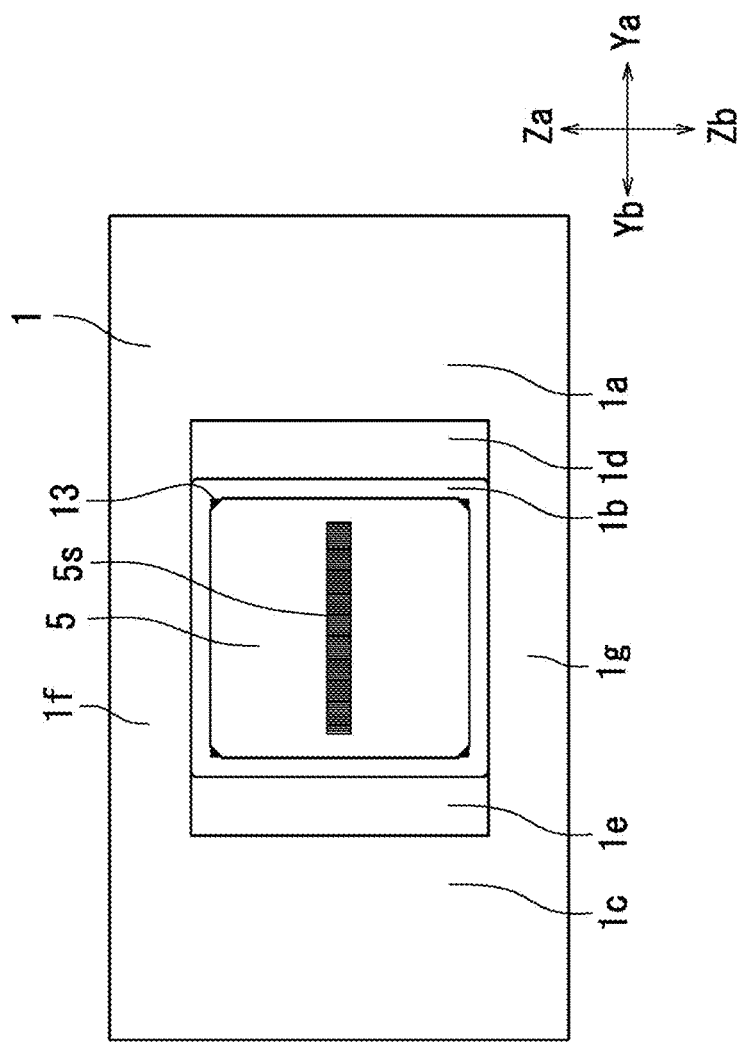
FIG. 17A is a view of the cooling assembly according to the seventh example embodiment of the present disclosure, as viewed from above in the first direction of the cold plate and an elastic member.
Figure 17B:
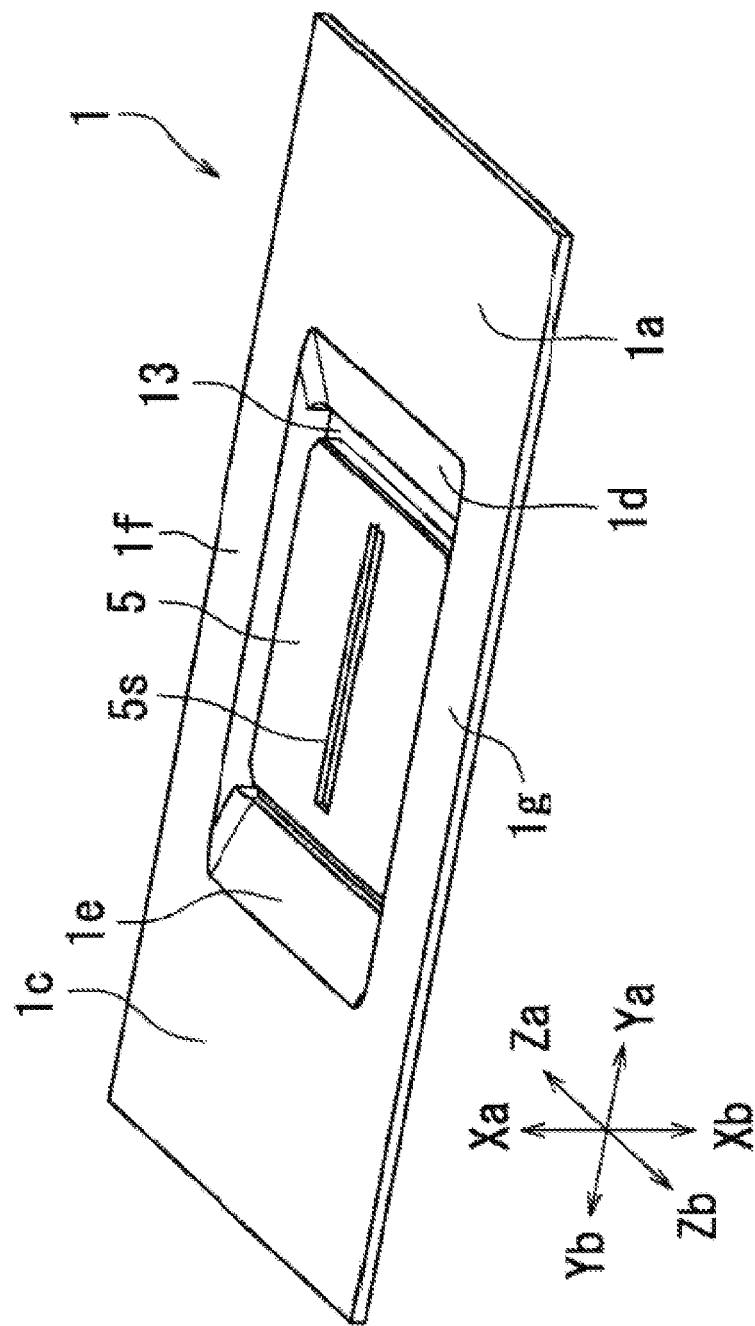
FIG. 17B is a schematic perspective view of the cold plate and the elastic member in the cooling assembly according to the seventh example embodiment of the present disclosure.

FIG. 17A is a view of the cold plate 1 and the elastic member 5 in the cooling assembly A according to the seventh example embodiment of the present disclosure as viewed from the upper side Xa in the first direction, and FIG. 17B is a schematic perspective view of the cold plate 1 and the elastic member 5 in the cooling assembly A according to the seventh example embodiment of the present disclosure.

As illustrated in FIGS. 17A and 17B, the elastic member 5 covers the fins 13 of the cold plate 1. More specifically, the elastic member 5 is in contact with the upper side Xa in the first direction of the fin 13. Typically, the length along the Y direction and the length along the Z direction of the elastic member 5 are substantially equal to the length along the Y direction and the length along the Z direction of the plurality of fins 13 of the cold plate 1.

The elastic member 5 has the slit 5s. The slit 5s extends in the second direction (Y direction). The slit 5s is located at the center of the elastic member 5 in the third direction (Z direction).

FIG. 18 is schematic exploded perspective view of the cooling assembly A according to the sixth example embodiment of the present disclosure. As illustrated in FIG. 18, the cooling assembly A includes a cold plate 1, a housing 2, a partition 3, a pump 4, an elastic member 5, and a sealing member Se. The cold plate 1 has a fin 13 on the upper side Xa in the first direction. The elastic member 5 is disposed between the cold plate 1 and the partition 3. The shape and size of the slit 5s of the elastic member 5 are substantially equal to the shape and size of the second through hole 32 of the partition 3.

The sealing member Se having an annular structure is attached to the cold plate 1. Typically, the sealing member Se is an O-ring. The elastic member 5 and the partition 3 are disposed inside the sealing member Se.

The partition 3 is sandwiched between the cold plate 1 and the housing 2. The pump 4 is disposed in the pump chamber 25 of the housing 2.

Figure 19:
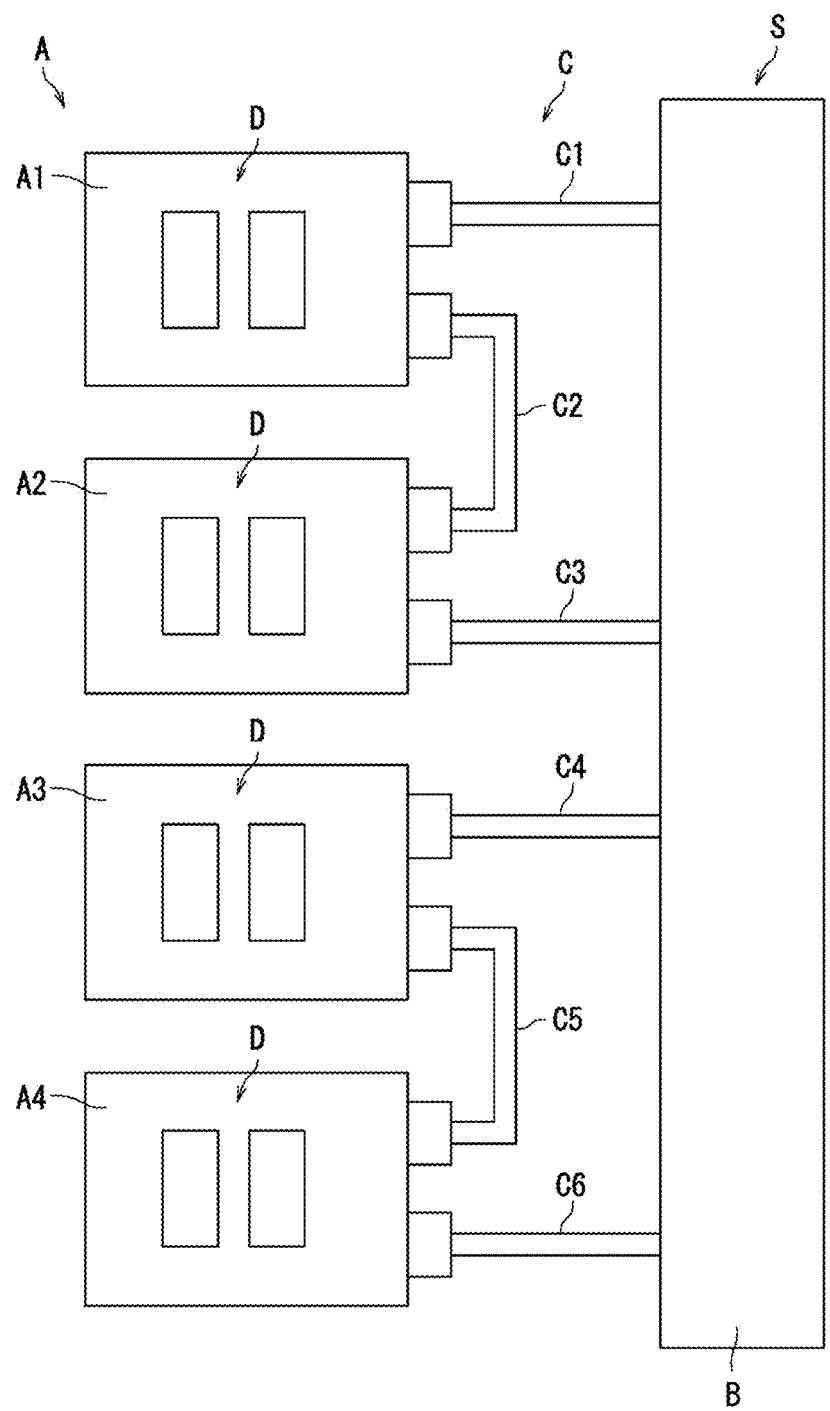
FIG. 19 is a schematic perspective view of a cooling system equipped with an example embodiment of a cooling assembly of the present disclosure.

FIG. 19 is a schematic perspective view of a cooling system S equipped with an example embodiment of a cooling assembly A of the present disclosure. As illustrated in FIG. 19, the cooling system S includes the cooling assembly A, a radiator B, and a coolant pipe C. The cooling assembly A and the radiator B are connected by a coolant pipe C.

The cooling assembly A is provided with a heat generating component D attached as a heat source, and the cooling assembly A receives heat from the heat generating component D. Examples of the heat generating component D include a microprocessor used in a computer, a power semiconductor used in an inverter, and the like. The cooling assembly A receives heat that transfers using the coolant flowing through the coolant pipe C into the radiator B. When the coolant having the heat flows through the radiator B, the heat is dissipated to the outside.

The cooling assembly A includes a first cooling assembly A1, a second cooling assembly A2, a third cooling assembly A3, and a fourth cooling assembly A4.

The coolant pipe C includes a first coolant pipe C1, a second coolant pipe C2, a third coolant pipe C3, a fourth coolant pipe C4, a fifth coolant pipe C5, and a sixth coolant pipe C6. The first coolant pipe C1 connects the radiator B and the inflow port 21 of the first cooling assembly A1. The second coolant pipe C2 connects the outflow port 22 of the first cooling assembly A1 and the inflow port 21 of the second cooling assembly A2. The third coolant pipe C3 connects the outflow port 22 of the second cooling assembly A2 and the radiator B.

The fourth coolant pipe C4 connects the radiator B and the inflow port 21 of the third cooling assembly A3. The fifth coolant pipe C5 connects the outflow port 22 of the third cooling assembly A3 and the inflow port 21 of the fourth cooling assembly A4. The sixth coolant pipe C6 connects the outflow port 22 of the fourth cooling assembly A4 and the radiator B.

The coolant flowing from the radiator B through the first coolant pipe C1 flows through the first cooling assembly A1, the second coolant pipe C2, the second cooling assembly A2, and the third coolant pipe C3 in this order, and returns to the radiator B. As described above, the coolant flowing from the radiator B through the first coolant pipe C1 circulates.

Similarly, the coolant flowing from the radiator B through the fourth coolant pipe C4 flows through the third cooling assembly A3, the fifth coolant pipe C5, the fourth cooling assembly A4, and the sixth coolant pipe C6 in this order, and returns to the radiator B. As described above, the coolant flowing from the radiator B through the fourth coolant pipe C4 circulates.

The above example embodiment is merely an example of the present disclosure. The configuration of the example embodiment may be appropriately changed without departing from the technical idea of the present disclosure. Example embodiments also may be implemented in combination as far as possible.

Features of the above-described example embodiments and the modifications thereof may be combined appropriately as long as no conflict arises.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A cooling assembly, comprising:
a cold plate in contact with heat generating circuitry;
a housing on one side of the cooling assembly in a first direction with respect to the cold plate;
a first wall between the housing and the cold plate; and
a second wall separating a plate chamber defined by the housing and the first wall into a first plate chamber and a second plate chamber adjacent in a second direction orthogonal to the first direction; wherein
the housing includes an intermediate passage connecting the first plate chamber and the second plate chamber;

the first wall includes:
a first through hole opposing the cold plate in the first plate chamber;
a second through hole opposing the cold plate in the second plate chamber and connecting the second plate chamber and the intermediate passage; and
a third through hole connecting the first plate chamber and the intermediate passage;
the intermediate passage is located between an end of the housing on the one side of the cooling assembly in the first direction and the first wall; and
both of the first plate chamber and the second plate chamber are located between an end of the cold plate on another side of the cooling assembly in the first direction and the first wall.

2. The cooling assembly according to claim 1, wherein the first through hole is located at a center in the second direction or a center in a third direction orthogonal to the first direction and the second direction in the first plate chamber; and
the second through hole is located at a center in the second direction or a center in the third direction in the second plate chamber.

3. The cooling assembly according to claim 1, wherein the housing includes:
an inflow port into which liquid flows; and
an outflow port through which the liquid flows out.

4. The cooling assembly according to claim 3, wherein the first wall and the second wall are portions of a single monolithic member.

5. The cooling assembly according to claim 3, further comprising:
a third wall separating a communication flow path and the intermediate passage; wherein
the third through hole is located between the second wall and the third wall in the second direction.

6. The cooling assembly according to claim 5, wherein the first wall and the third wall are portions of a single monolithic member.

7. The cooling assembly according to claim 5, wherein the third wall and the housing are portions of a single monolithic member.

8. The cooling assembly according to claim 5, further comprising:
a pump; and
a fourth wall; wherein
the pump includes a motor, a casing, and an impeller;
the impeller is housed in an impeller chamber defined by the fourth wall and the casing;
the housing includes a pump inflow side flow path connecting the second plate chamber and the impeller chamber; and
the fourth wall includes a suction port connecting the pump inflow side flow path and the impeller chamber.

9. The cooling assembly according to claim 8, wherein the inflow port and the outflow port are located on one side in the second direction with respect to the housing.

10. The cooling assembly according to claim 9, wherein the pump is on one side in the second direction of the cooling assembly;
the inflow port, the communication flow path, the first plate chamber, the intermediate passage, the second plate chamber, the pump inflow side flow path, the impeller chamber, and the outflow port are connected in this order; and
the communication flow path bypasses the intermediate passage and extends from the one side in the second direction to another side in the second direction.

11. The cooling assembly according to claim 1, wherein the cold plate includes fins on a surface of the cold plate on the one side in the first direction;
the fins are located in at least one of the first plate chamber and the second plate chamber; and
the first through hole or the second through hole is located on the one side in the first direction of the fins.

12. The cooling assembly according to claim 11, wherein the fins are arrayed in the second direction; and
the second through hole extends in the second direction.

13. A cooling assembly, comprising:
a cold plate in contact with a heat generating circuitry;
a housing on one side of the cooling assembly in a first direction with respect to the cold plate;
a first wall between the housing and the cold plate;
a second wall separating a plate chamber defined by the housing and the first wall into a first plate chamber and a second plate chamber adjacent in a second direction orthogonal to the first direction;
a pump; and
a fourth wall; wherein
the housing includes an intermediate passage connecting the first plate chamber and the second plate chamber;
the first wall includes:
a first through hole opposing the cold plate in the first plate chamber;
a second through hole opposing the cold plate in the second plate chamber and connecting the second plate chamber and intermediate passage; and
a third through hole connecting the first plate chamber and the intermediate passage;
the pump includes a motor, a casing, and an impeller;
the impeller is housed in an impeller chamber defined by the fourth wall and the casing;
the housing includes a pump inflow side flow path connecting the second plate chamber and the impeller chamber;
the fourth wall includes a suction port connecting the pump inflow side flow path and the impeller chamber; and
the first through hole and the third through hole are arranged to overlap in the second direction.

14. The cooling assembly according to claim 13, wherein the housing includes:
an inflow port into which liquid flows; and
an outflow port through which the liquid flows out.

15. The cooling assembly according to claim 14, further comprising:
a third wall separating a communication flow path and the intermediate passage; wherein
the third through hole is located between the second wall and the third wall in the second direction.

16. The cooling assembly according to claim 13, wherein the inflow port and the outflow port are located on one side in the second direction with respect to the housing.

17. The cooling assembly according to claim 16, wherein the pump is on one side in the second direction of the cooling assembly;
the inflow port, the communication flow path, the first plate chamber, the intermediate passage, the second plate chamber, the pump inflow side flow path, the impeller chamber, and the outflow port are connected in this order; and the communication flow path bypasses the intermediate passage and extends from the one side in the second direction to another side in the second direction.

18. The cooling assembly according to claim 13, wherein the cold plate includes fins on a surface of the cold plate on the one side in the first direction;

the fins are located in at least one of the first plate chamber and the second plate chamber; and the first through hole or the second through hole is located on the one side in the first direction of the fins.

19. The cooling assembly according to claim 18, wherein the fins are arrayed in the second direction; and the second through hole extends in the second direction.

20. The cooling assembly according to claim 13, further comprising:

a third wall separating a communication flow path and the intermediate passage; wherein the third through hole is located between the second wall and the third wall in the second direction;

the suction port is arranged to overlap the first through hole and the third through hole in the second direction; and the first through hole and the third through hole are located on opposite sides of the third wall in the second direction.

* * * * *